(12) United States Patent
Kintali et al.

(10) Patent No.: US 10,140,099 B2
(45) Date of Patent: Nov. 27, 2018

(54) SYSTEMS AND METHODS FOR GENERATING CODE FROM EXECUTABLE MODELS WITH FLOATING POINT DATA

(71) Applicant: The MathWorks, Inc., Natick, MA (US)

(72) Inventors: Kiran K. Kintali, Ashland, MA (US); Shomit Dutta, Ashland, MA (US); Anand S. Krishnamoorthi, Arlington, MA (US); Ebrahim Mehran Mestchian, Newton, MA (US)

(73) Assignee: The MathWorks, Inc., Natick, MA (US)

( * ) Notice: Subject to any disclaimer, the term of this patent is extended or adjusted under 35 U.S.C. 154(b) by 0 days.

(21) Appl. No.: 15/398,176

(22) Filed: Jan. 4, 2017

(65) Prior Publication Data

US 2017/0351493 A1 Dec. 7, 2017

Related U.S. Application Data

(60) Provisional application No. 62/344,310, filed on Jun. 1, 2016.

(51) Int. Cl.
| | |
|---|---|
| *G06F 9/44* | (2018.01) |
| *G06F 8/35* | (2018.01) |
| *G06F 8/20* | (2018.01) |

(52) U.S. Cl.
CPC . *G06F 8/35* (2013.01); *G06F 8/20* (2013.01)

(58) Field of Classification Search
CPC ......................................................... G06F 8/35

(Continued)

(56) References Cited

U.S. PATENT DOCUMENTS

| | | |
|---|---|---|
| 5,561,615 A | 10/1996 | Kuo et al. |
| 7,085,702 B1 | 8/2006 | Hwang et al. |

(Continued)

FOREIGN PATENT DOCUMENTS

| | | |
|---|---|---|
| WO | WO-2007/035702 A2 | 3/2007 |
| WO | WO-2008/027590 A2 | 3/2008 |

OTHER PUBLICATIONS

Anjanasasidharan, Ms., et al. "Vhdl Implementation of IEEE 754 Floating Point Unit," IEEE, International Conference on Information Communication and Embedded Systems (ICICES2014), Feb. 1, 2014, pp. 1-5.

(Continued)

*Primary Examiner* — Evral E Bodden
(74) *Attorney, Agent, or Firm* — Cesari and McKenna, LLP; Michael R. Reinemann

(57) ABSTRACT

Systems and methods generate code from an executable model. The model may operate on variables having floating point data types. The systems and methods may unpack the sign, exponent, and mantissa components of the floating point variables, and interpret them as boolean, integer, or fixed-point data types. The systems and methods may include operators that operate on the extracted sign, exponent, and mantissa components, and that produce sign, exponent, and mantissa outputs having boolean, integer or fixed-point data types. The systems and methods may pack the sign, exponent, and mantissa components of the output into an integer and reinterpret the integer as a floating point data type. Having replaced the floating point data types with boolean, integer or fixed-point data types, the generated code may be suitable for programmable logic devices and/or microcontrollers that lack Floating Point Units (FPUs).

45 Claims, 28 Drawing Sheets

(58) Field of Classification Search
USPC .......................................................... 717/104
See application file for complete search history.

(56) References Cited

U.S. PATENT DOCUMENTS

| | | | |
|---|---|---|---|
| 7,110,935 | B1 | 9/2006 | Hwang et al. |
| 7,318,014 | B1 | 1/2008 | Molson et al. |
| 7,969,452 | B2 | 6/2011 | Clark et al. |
| 8,135,570 | B2 | 3/2012 | Linebarger et al. |
| 8,407,271 | B2 | 3/2013 | Hurd et al. |
| 8,484,262 | B1 | 7/2013 | Bryan |
| 8,984,496 | B2 | 3/2015 | Devane et al. |
| 9,075,630 | B1 | 7/2015 | Smith et al. |
| 9,436,442 | B1 | 9/2016 | Kintali et al. |
| 9,454,627 | B1 | 9/2016 | Venkataramani et al. |
| 2005/0039107 | A1* | 2/2005 | Hander ............... G06F 17/2881 715/256 |
| 2008/0040409 | A1 | 2/2008 | Matsuzaki |
| 2008/0109100 | A1* | 5/2008 | Macharia .................. C10L 1/02 700/110 |
| 2012/0173465 | A1* | 7/2012 | Hore ..................... G06N 99/005 706/12 |
| 2012/0259904 | A1 | 10/2012 | Bishop |
| 2014/0279815 | A1* | 9/2014 | Wang ....................... G06N 5/04 706/52 |
| 2016/0357534 | A1 | 12/2016 | Krishnamoorthi et al. |

OTHER PUBLICATIONS

"European Search Report," European Application No. 17173986, dated Oct. 2, 2017, pp. 1-5.
"Floating-point Arithmetic," Wikipedia, May 26, 2016, Retrieved from the Internet: <https://en.wikipedia.org/w/index.php?title=Floating-point_arithmetic&oldid=722188619#Addition_and_subtraction>, Retrieved on Jul. 12, 2017, pp. 1-27.
Marcus, Guillermo, et al. "A Fully Synthesizable Single-Precision, Floating-Point Adder/Substractor and Multiplier in VHDL for General and Educational Use," IEEE, Proceedings of the Fifth IEEE International Caracas Conference on Devices, Circuits and Systems, Dominican Republic, vol. 1, Nov. 3-5, 2004, pp. 319-323.
Marcus, Guillermo, "VHDL Entity work.FPadd.symbol: VHDL Entity work.FPadd.single_sycle," Jan. 1, 2004, Retrieved from the Internet: <https://opencores.org/download,fpuvhd1>, Retrieved on Jul. 13, 2017pp. 1-10.
Roy, Sanghamitra, et al., "An Algorithm for Converting Floating-Point Computations to Fixed-Point in MATLAB based FPGA design," ACM, DAC'04, San Diego, California, USA, Jun. 7-11, 2004, pp. 484-487.
Bryant, Randal E., et al., "Deciding Bit-Vector Arithmetic with Abstraction," O. Grumberg and M. Huth (eds.), TACAS 2007, LNCS 4424, Springer-Verlag Berlin Heidelberg, Mar. 2007, pp. 358-372.
"CORE Generator Guide," Xilinx, Xilinix, Inc., 2003, pp. 1-146.
"Fixed-Point Designer™: User's Guide," R2016a, The MathWorks, Inc., Mar. 2016 pp. 1-2124.
Harries, Ian, "Floating Point Numbers," retrieved from <https://www.doc.ic.ac.uk/~eedwards/compsys/float/>, Dec. 2, 2004, pp. 1-5.
"HDL Coder™: User's Guide," R2016a, The MathWorks, Inc., Mar. 2016, pp. 1-1264.
"MATLAB to FPGA Using HDL Coder™," Loren on the Art of MATLAB, Published with MATLAB R2013a, retrieved from <http://blogs.mathworks.com/loren/2013/04/11/matlab-to-fpga-using-hdl-codertm/>, Apr. 11, 2013, pp. 1-12.
Wang, Cheng, et al., "An Automated Fixed-Point Optimization Tool in MATLAB XSG/SynDSP Environment," Review Article, International Scholarly Research Network, ISRN Signal Processing, vol. 2011, Article ID 414293, Jan. 20, 2011, pp. 1-17.
Banerjee, P., "An Overview of a Compiler for Mapping MATLAB Programs onto FPGAs", Department of Electrical and Computer Engineering, Northwestern University, IEEE, Proceedings of the ASP-DAC Asia and South Pacific Design Automation Conference, . . . Kitakyushu, Japan, Japan, Jan. 24, 2003, 6 pages.
Belanović, Pavle, et al., "Automated Floating-point to Fixed-point Conversion with the fixify Environment," CD Laboratory for Design Methodology of Signal Processing Algorithms Vienna University of Technology, Austria, IEEE, IEEE Computer Society, Proceedings of the 16th International Workshop on Rapid System Prototyping 2005, (RSP'05), Montreal, Quebec, Canada, Jun. 8-10, 2005, pp. 1-7.
Chou, Bill, et al., "Converting Models from Floating Point to Fixed Point for Production Code Generation," The MathWorks, Inc., MATLAB Digest, Nov. 2008, pp. 1-6.
Roy, Sanghamitra, et al., "An Algorithm for Converting Floating-Point Computations to Fixed-Point in MATLAB based FPGA design," Northwestern University—DAC'04, ACM, Proceedings of the 41st Design Automation Conference, 2004, San Diego, California, USA, Jun. 7-11, 2004, pp. 484-487.
Shi, Changchun, et al., "An Automated Floating-Point to Fixed-Point Conversion Methodology," Berkeley Wireless Research Center, Department of EECS, University of California, Berkeley, USA, IEEE, 2003 IEEE International Conference on Acoustics, Speech, and Signal Processing, 2003, Proceedings, (ICASSP '03), Hong Kong, China, Apr. 6-10, 2003, pp. 1-4.
Zhang, Linsheng, et al., "Floating-point to Fixed-point Transformation using Extreme Value Theory," Department of Electronic and Information Engineering Harbin Institute of Technology Shenzhen Graduate School Shenzhen 518055, China, IEEE Computer Society, 2009 Eight IEEE/ACIS International Conference on Computer and Information Science, Shanghai, China, Jun. 1-3, 2009, pp. 271-276.
Zhao, Jisheng, et al., "Intermediate Language Extensions for Parallelism," ACM, SPLASH'11 Workshops, Portland, Oregon, USA, Oct. 23-24, 2011, pp. 1-12.

* cited by examiner

| FIG. 10A |
|----------|
| FIG. 10B |

```
function y = ulpErrCheck (P,R, ToleranceValue)
ulp = ToleranceValue;

P_fpt = fi (typecast (single (P) , 'int32' ) , 1, 32, 0) ;
R_fpt = fi (typecast (single (R) , 'int32' ) , 1, 32, 0) ;
if   (P_fpt < 0)
     % lexographic two's complement ordering
     P_fpt = fi (hex2dec ( '80000000' ) - P_fpt,  1,  32, 0) ;
end
if   (R_fpt < 0)
     % lexographic two's complement ordering
     R_fpt = fi (hex2dec ( '80000000' ) - R_fpt,  1, 32, 0) ;
end
error = abs (P_fpt - R_fpt) ;
if (error > ulp)
    y = false;
else
    y = true;
end
end
```

FIG. 12

```
function err = ulpErrorCheck (P,  R,  tolerance)
    P_fpt = fi (typecast (single (P) , 'int32' ) , 1, 32, 0) ;
    R_fpt = fi (typecast (single (R) , 'int32' ) , 1, 32, 0) ;
    same_sign = (sign(P) == sign (R) ) ;
    if (same_sign) % same sign
        err = (abs(P_fpt - R_fpt) <= tolerance) ;
    else % different sign
        err = ( (abs (P_fpt) + abs (P_fpt) ) <= tolerance) ;
    end
end
```

FIG. 13

```
function err = relativeErrorCheck (P, Q, tolerance)
    absdiff = abs (P - Q);
    if (absdiff < tolerance) % absolute error check
      err = 1;
    elseif (P == Q) % check infinities
      err = 1;
    elseif (P*Q == 0.0) % either is zero
      err = (absdiff < tolerance);
    else % relative error check
      err = absdiff/max(abs(P), abs (Q)) < tolerance;
    end
end
```

FIG. 14

Example Code for Product                    2500

```
ENTITY nfp_mul_comp IS
    PORT ( clk       :  IN   std_logic ;
           reset     :  IN   std_logic ;
           enb       :  IN   std_logic ;
           nfp_in1   :  IN   std_logic_vector (31 DOWNTO 0) ;  -- ufix32
           nfp_in2   :  IN   std_logic_vector (31 DOWNTO 0) ;  -- ufix32
           nfp_out   :  OUT  std_logic_vector (31 DOWNTO 0)    -- ufix32
         );
END nfp_mul_comp
```

Pack

```
    SIGNAL AS     : std_logic ; -- ufix1
    SIGNAL AE     : unsigned (7  DOWNTO 0) ; -- ufix8
    SIGNAL AM     : unsigned (22 DOWNTO 0) ; -- ufix23

SIGNAL BS     : std_logic ; -- ufix1
    SIGNAL BE     : unsigned (7  DOWNTO 0) ; -- ufix8
    SIGNAL BM     : unsigned (22 DOWNTO 0) ; -- ufix23
```

Unpack

```
AS <= nfp_in1_unsigned (31) ;
AE <= nfp_in1_unsigned (30 DOWNTO 23) ;
AM <= nfp_in1_unsigned (22 DOWNTO 0) ;

BS <= nfp_in2_unsigned (31) ;
BE <= nfp_in2_unsigned (30 DOWNTO 23) ;
BM <= nfp_in2_unsigned (22 DOWNTO 0) ;
```

Pack

```
nfp_out_pack <= Delay_out1 & Delay1_out1_3 & Delay2_out1_3 ;
```

*FIG. 25*

SYSTEMS AND METHODS FOR GENERATING CODE FROM EXECUTABLE MODELS WITH FLOATING POINT DATA

CROSS-REFERENCE TO RELATED APPLICATIONS

This application claims the benefit of Provisional Patent Application Ser. No. 62/344,310, filed Jun. 1, 2016, for Systems and Methods for Generating Code from Executable Models with Floating Point Data, which application is hereby incorporated by reference in its entirety.

COMPUTER PROGRAM LISTING

A portion of the disclosure of this patent document contains material that is subject to copyright protection. The copyright owner has no objection to facsimile reproduction by anyone of the patent document for the patent disclosure, as it appears in the United States Patent and Trademark Office patent file or records, but otherwise reserves all copyright rights whatsoever. Copyright © 2016 The MathWorks, Inc.

Applicant submits herewith Computer Program Listings, which are included as Appendices A-C attached hereto.

BRIEF DESCRIPTION OF THE DRAWINGS

The description below refers to the accompanying drawings, of which:

FIG. 12 is an illustration of example error checking code in accordance with an embodiment;

FIG. 13 is an illustration of another example error checking code in accordance with an embodiment;

FIG. 14 is an illustration of yet another example error checking code in accordance with an embodiment;

FIG. 25 is example code in accordance with an embodiment;

DETAILED DESCRIPTION OF ILLUSTRATIVE EMBODIMENTS

Figure 1:
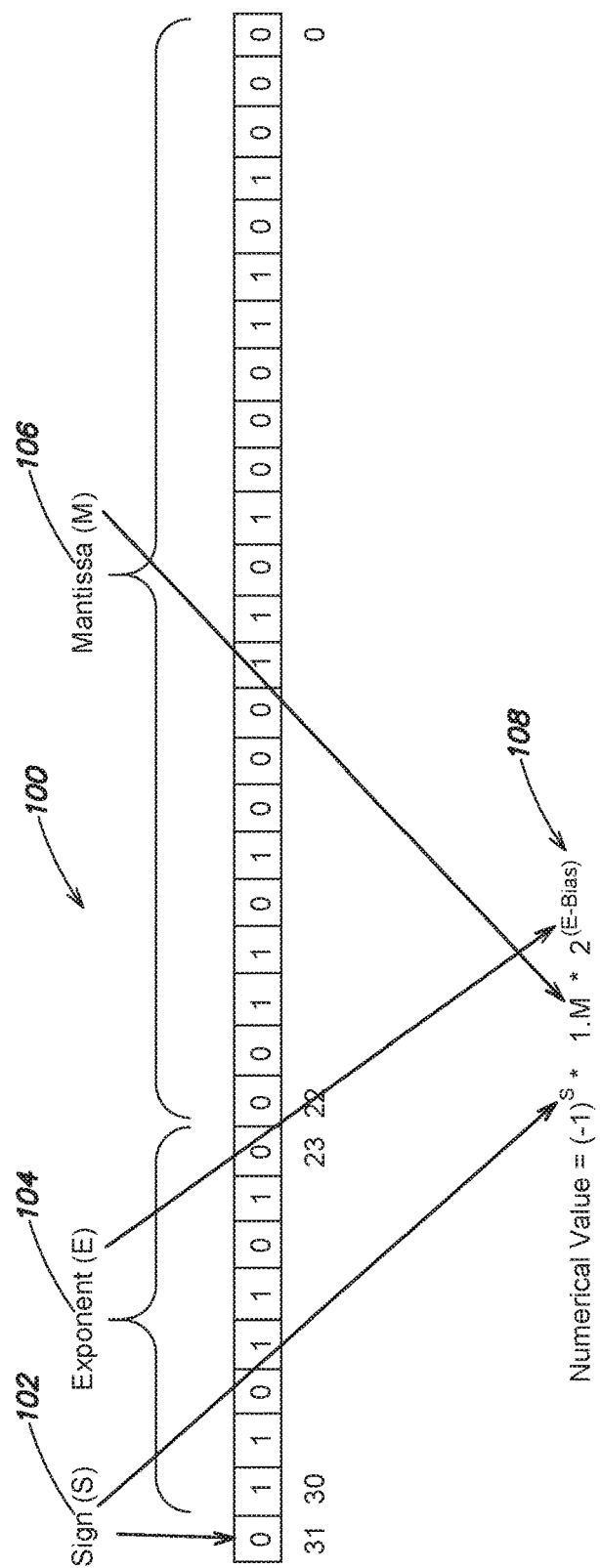
FIG. 1 is a schematic illustration of an example single-precision binary floating point data type.

Electronic devices, such as consumer electronics, appliances, and controllers used in factories, automobiles and aircraft, often include programmable logic devices, such as Application Specific Integrated Circuits (ASICs), Field Programmable Gate Arrays (FPGAs), or Complex Programmable Logic Devices (CPLDs), configured to perform various operations. Electronic devices may alternatively or additionally include microcontrollers, such as Digital Signal Processors (DSPs). The programmable logic devices and microcontrollers may be configured by software program code. The configuration of such devices may start with a modeling phase. For example, an executable model that implements functionalities to be performed by an electronic device may be created in a modeling environment. The model may be simulated, e.g., run, by the modeling environment, and the results produced by the model may be analyzed. The model may include linked or interconnected computational elements.

Variables, such as signals, parameters, states, or other numeric data processed by or included in a model, such as a Simulink model, or in a program, such as a MATLAB program, may have a data type. Data type refers to the way in which numbers are represented in computer memory. A data type may determine the amount of storage allocated to a number, the method used to encode the number's value as a pattern of binary digits, and the operations available for manipulating the data type. Different data types may have different precision, dynamic range, performance, and memory usage. A modeling environment may support multiple different data types. Exemplary numeric data types include: integers, floating point, fixed point, and Boolean.

Integers may represent whole numbers, and may be sub-typed according to their ability to contain negative values. Exemplary integer data types include: signed 8-bit integer (int8), unsigned 8-bit integer (uint8), signed 16-bit integer (int16), unsigned 16-bit integer (unit16), signed 32-bit integer (int32), unsigned 32-bit integer (uint32), unsigned 64-bit integer (uint64), and signed 64-bit integer (int64).

Floating point data types may contain fractional values. Exemplary floating point data types include double-precision floating point (double), single-precision floating point (single), and half-precision floating point (half). A floating point data type represents numeric values in scientific notation. The IEEE Standard for Floating Point Arithmetic 754 (IEEE 754) specifies standards for floating point computations, and defines several floating point formats commonly used in computing. These floating point formats include 64-bit double-precision binary floating point (double), 32-bit single-precision binary floating point (single), and 16-bit half-precision binary floating point (half), among others. A floating point format may have a word length, and may include a 1-bit sign (S) value, a multi-bit exponent (E) value, and a multi-bit mantissa (M) or fractional value. For a single floating point format, the word length is 32-bits, the sign bit is at bit position 31, the exponent is 8-bits and is located at bit positions 23-30, and the mantissa is 23-bits and is located at bit positions 0-22. For performance reasons, such as area consumption, custom floating point formats may be utilized having exponent and mantissa lengths different from those used in double, single, and half floating point formats. For example, floating point formats having 24-32 bit word lengths may be used. A fixed-point data type may be characterized by a word length in bits, the position of the binary point, and whether the fixed-point data type is signed or unsigned. Scaling may refer to the technique used to represent real-world values, such as rational numbers, as fixed-point numbers. Exemplary techniques include binary-point scaling and slope-bias scaling. With binary point-only scaling, the slope is 1 and the bias is 0, and scaling is defined by moving the binary point left or right. Changing the location of the binary point in a fixed-point data type causes a trade-off between range and resolution. For binary-point scaling, a fixed point data type may be represented as:

fixdt(Signed, WordLength, FractionLength),
where
'Signed' specifies whether the fixed point data type is signed (0) or unsigned (1),
'WordLength' specifies the word length of the fixed point data type in bits, e.g., 8 bits, 16-bits, 32-bits, etc., and
'FractionLength' specifies the fraction length of the fixed point data type in bits, e.g., 1, 2, 3, etc.

For slope-bias scaling, a fixed point data type may be represented as:

fixdt(Signed, WordLength, FractionLength, Slope, Bias),
where
'Signed' specifies whether the fixed point data type is signed (0) or unsigned (1),
'WordLength' specifies the word length in bits, and
'Slope' and 'Bias' specify values for slope-bias scaling.

A Boolean data type may represent values as 1 and 0, e.g., True and False.

A modeling environment may assign default data types to variables or other data, for example based on the model elements included in the model. In addition, variables or model elements may inherit data types from other variables or model elements. Nonetheless, a default data type may be overridden, for example by a user choosing a particular data type for one or more variables or other data of a model. In some situations, it may be desirable to use floating point numeric data types in a model, such as double or single precision floating point data types, as default data types, because those data types provide a wide dynamic range, and may be useful when the range is unknown. Floating-point data types may also be more suitable with non-linear operations and with reciprocal operations (in which small inputs may create large outputs, and large inputs may create small outputs, etc.) Converting such floating-point data types to fixed-point data types to represent both spectrums of dynamic range large word lengths (range) and large fractions (precision), when targeting embedded hardware, can be a challenge.

When the design of a model is completed, code may be generated for the model, and the generated code may be deployed to an electronic device. The modeling environment may include a code generator, or a separate code generator program may be used. The code generator may generate code, such as source code, that when compiled and executed has equivalent behavior as the executable model for which the code is generated. The generated code may represent data according to the data types implemented in the model. For example, if the data type specified for variables included in a model is floating point, the generated code may contain variables having a floating point format. The code may also include instructions that perform floating point operations, such as floating point arithmetic or mathematical operations on those variables.

Many programmable logic devices and microcontrollers, however, do not include Floating Point Units (FPUs). As a result, before generating code for such devices, the model may need to be converted from using floating point data types to using only integer and/or fixed-point data types. For example, one or more model elements, e.g., blocks, of the model, that operate on floating point values, may need to be replaced with (or converted to) model elements that operate on fixed-point and/or integer values. In some embodiments, an entire model may need to be changed from floating point to fixed point. This can be a time-consuming and error prone process. In addition, it may result in a change to the data precision and/or a loss of the dynamic range aspect of the data representation. Furthermore, if a model is changed, for example, by replacing one or more floating point blocks with fixed-point blocks, the model may have to be re-verified. This can introduce additional delays into the product development cycle. In addition while exploring numerical precision trade-offs, model developers may want to try different fixed-point formats, e.g., varying wordlengths, etc. Each iteration of a new fixed-point format requires reconversion and revalidation.

In some cases, a designer may know the particular programmable logic device onto which the generated code is to be deployed, such as a particular FPGA product. If so, vendor-specific primitives that are custom built for the particular programmable logic device may be used during the generation of code from a model. The vendor-specific primitives may be stored in a floating point library, and accessed by the code generator to implement fixed-point representations of floating point blocks that may be included in the model. Examples of vendor-specific primitives include LogiCORE Intellectual Property (IP) cores from Xilinx, Inc. of San Jose, Calif. and Megafunctions from Altera Corp. of San Jose, Calif. However, the use of such primitives results in generated code that is target-specific. The generated code cannot be ported to other devices, such as different programmable logic devices from the same or a different vendor. This can severely limit the usefulness of the generated code. In addition, such primitives are typically not in a form that permits optimization of the generated code. That is, the primitives appear as black boxes, preventing optimizations from being performed.

A method comprises, for a model comprising model elements, where a first model element comprises a first operator to operate on one or more first inputs, a second model element comprises a second operator to operate on one or more second inputs, one of the one or more first inputs has a first data type, one of the one or more second inputs has a second data type, the second data type is the same as, or is different from, the first data type, the first and second data types comprise single, double, or integer, and values of the one or more first inputs are in a form comprising floating point or fixed point, analyzing the first operator and the one or more first inputs, the analyzing comprising analyzing the first data type, determining whether the one or more first inputs are to be interpreted based on the analyzing, interpreting the one of the one or more first inputs as a first integer, a second integer, and a third integer, and generating code for the model, the generating code comprising generating first code for the one or more first inputs and the first operator, wherein the first code comprises variables representing the first integer, the second integer, or the third integer and a function that performs functionalities on the variables representing the first operator operating on the one of the one or more first inputs.

The first integer, the second integer, and the third integer may represent a sign, an exponent, and a mantissa that correspond to the one of the one or more first inputs may be interpreted based on a standard, such as the IEEE standard 754.

The code may comprise C code, C++ code, MATLAB code, SystemC code, HDL (hardware description language) code, VHDL (VHSIC Hardware Description Language), Verilog, SystemVerilog, PLC (programmable logic controller) code that complies with IEC 61131-3 standard, assembly code, or executable binary code.

The model and the code may be in the same programming language, the model may comprise a floating point algorithm, and the code may be free of any floating point numeric or expressions.

The first code may comprise instructions for synthesizing programmable hardware or embedded hardware that does not necessarily have the capability of handling floating point values.

The programmable hardware or embedded hardware may comprise integer-only micro controllers, FPGA (field-programmable gate array) units without floating point cores, or PLC units without floating point support.

The one or more first inputs may have different data types and the determining may comprise determining that fewer than all of the one or more first inputs are to be interpreted.

The first code may comprise other variables representing those of the one or more first inputs that are not interpreted.

The model may comprise a textual model, a graphical model, or a model that includes a graphical component and a textual component, and the model may comprise floating point numbers or expressions.

The model may comprise a Simulink model, a MATLAB model, a Simscape model, a Stateflow model, a Modelica model, a UML (unified modeling language) model, or a Systems Modeling Language (SysML) model.

The first code may comprise constant data representing the first integer, second integer, or the third integer, and the constant data may be generated based on the one or more inputs and an analysis of the model.

The method may further comprise analyzing the second operator and the one or more second inputs, the analyzing may comprise analyzing the second data type, and determining whether the one or more second inputs are to be interpreted, independently of determining whether the one or more first inputs are to be interpreted.

The model may comprise a group of model elements comprising a group of operators, one or more inputs to the group of model elements may have fixed point values, one or more outputs from the group of model elements may have floating point values, and inputs and outputs inside the group may have floating point values. The method may further comprise analyzing the model to identify the group of model elements, converting the one or more inputs to the group of model elements to one or more converted inputs that have floating point values and the one or more outputs from the group of model elements into one or more converted outputs that have fixed point values, and interpreting each of the one or more converted inputs and the inputs and outputs inside the group as three integers.

The model elements may comprise multiple operators comprising the first and the second operators, each of the multiple operators may operate on one or more respective inputs, and a first set of the multiple operators may have floating point values for the one or more respective inputs. A second set of multiple operators may have fixed point values for the one or more respective inputs, and a third set of multiple operators may have floating point values and fixed point values for the one or more respective inputs. The method may further comprise forming, based on functionalities of the operators and data types of the respective inputs, at least two groups of operators, wherein a first one of the two groups comprises operators operating on respective inputs having floating point values and a second one of the two groups comprises operators operating on respective inputs having fixed point values, and interpreting each of the respective inputs of each operator in the first one of the two groups as a respective first integer, a respective second integer, and a respective third integer.

The method may further comprise interpreting the respective one or more inputs of selected ones of the multiple operators to reach a consistent interpretation for all inputs of the multiple operators in the model.

The code generated for the model may comprise variables representing the respective first integer, the respective second integer, and the respective third integer, and variables representing the respective one or more inputs of the operators in the second one of the two groups.

The method may further comprise analyzing the model to determine absence of one or more numerical conditions that are part of the IEEE standard, and generating code for the model may comprise generating code that complies with the IEEE standard without accounting for the one or more numerical conditions that have been determined to be absent from the model.

The one or more numerical conditions may comprise the occurrence of values including denormals or subnormals, negative or positive infinities, negative or positive zeros, or NaNs (not a number) that comprises quiet NaNs or signaling NaNs.

The analyzing the model may comprise analyzing the first, second, and third integers.

The analyzing the model may comprise analyzing the model using static methods.

The method may further comprise detecting overflow or underflow conditions that occur in floating point calculations within the model and that are not in compliance with the IEEE 754 standard, and the overflow or underflow conditions may comprise negative or positive overflows or underflows, or zero, and the detecting may be based on the first, second, and third integers.

Embodiments of the present disclosure relate to systems and methods for generating code from an executable model. The executable model may be created and run in a modeling environment, and may implement a desired algorithmic behavior. One or more model elements may operate on values, such as values of variables, having a floating point data type. The systems and methods may include a code generator that generates code directly from the executable model having floating point data types. The code generator, however, may reinterpret the floating point data types of the executable model as integer data types, and decompose or slice the bit representation into S,E,M values, which may be represented, for example, in integer, fixed-point, or Boolean data types. The code generator may generate code that implements a behavior equivalent to the algorithmic behavior of the executable model. Having reinterpreted the floating point data types of the executable model as integers and decomposed the bits to S,E,M values with integer, fixed-point or Boolean data types, the generated code may be suitable for use with programmable logic devices and/or microcontrollers that lack Floating Point Units (FPUs).

A floating point data type can be stored in computer memory according to IEEE standard 754. For example, a data value 'D' that has a floating point data type can be interpreted and decomposed in three integer numbers: sign (S), exponent (E), and mantissa (M). The data value 'D' may have single precision, double precision, or half precision. In some implementations, the data type of the sign (S) may be considered a Boolean data type, as the value of the sign (S) is 0 or 1. The data value 'D' may be expressed as:

$$D=(-1)^{S}*1.M*2^{(E-BIAS)}$$

As an example, FIG. 1 is a schematic illustration of the base 10 data value 2.982753E27 stored in a computer in a single-precision binary floating point data type format 100. The format 100 may have a word length of 32-bits, and include a 1-bit sign (S) value 102 at bit position 31, an 8-bit exponent (E) value 104 at bit positions 23-30, and a 23-bit mantissa (M) value 106 at bit positions (0-22). The floating point data type format 100 may encode a value in scientific notation form, as indicated at 108 using the sign bit 102, the exponent 104 less a bias value, and the mantissa 106 stored in the 32-bit word length. The mantissa 106 may represent the fractional portion of a normalized, binary value in scientific notation. For single precision floating point, the bias value of the exponent is 127. For double precision, the bias value of the exponent is 1023.

For example, the number (base 10) −2345.125 when converted to binary (base 2) is −100100101001.001. When normalized, the number is −1.00100101001001×$2^{11}$. The 8-bit biased exponent E of the single floating point representation of this number is E=11−127=138(base 10)=10001010(base 2).

The 32-bit fractional mantissa is

M=00100101001001000000000

Accordingly, the IEEE 754 single precision floating point representation of the (base 10) number −2345.125 is:

| Sign (S) | Exponent (E) | Mantissa (S) |
|---|---|---|
| 1 | 10001010 | 00100101001001000000000 |

Figure 22:
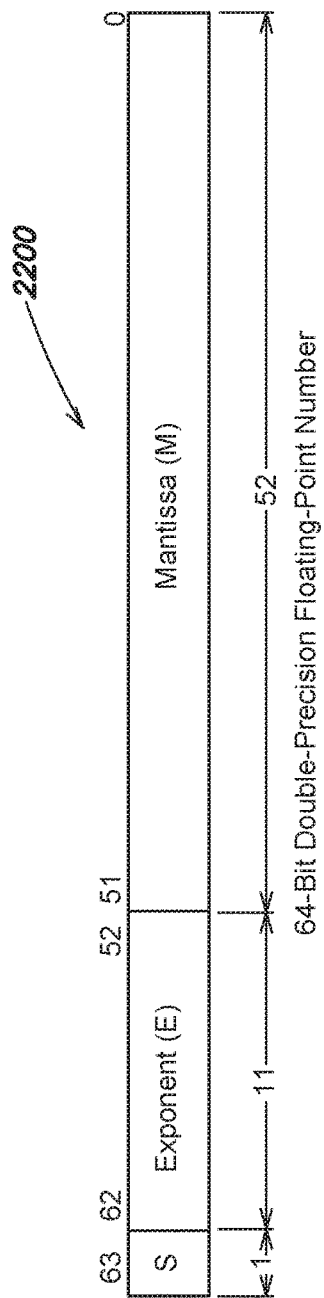
FIG. 22 is a schematic illustration of an example double-precision floating point data type format.

FIG. 22 is a schematic illustration of an example double-precision floating point data type format 2200.

Figure 23:
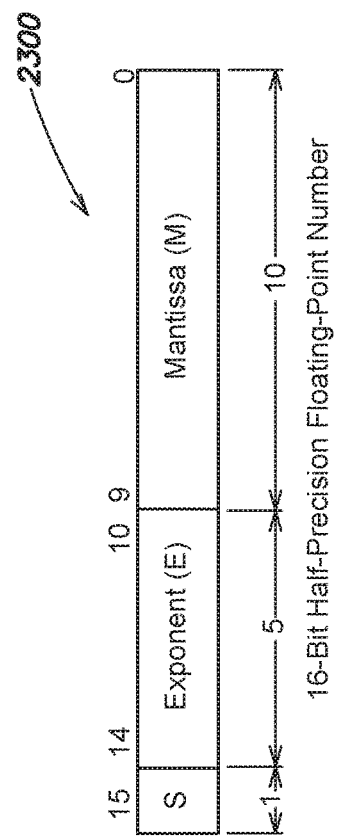
FIG. 23 is a schematic illustration of an example half-precision floating point data type format.

FIG. 23 is a schematic illustration of an example half-precision floating point data type format 2300.

Figure 2:
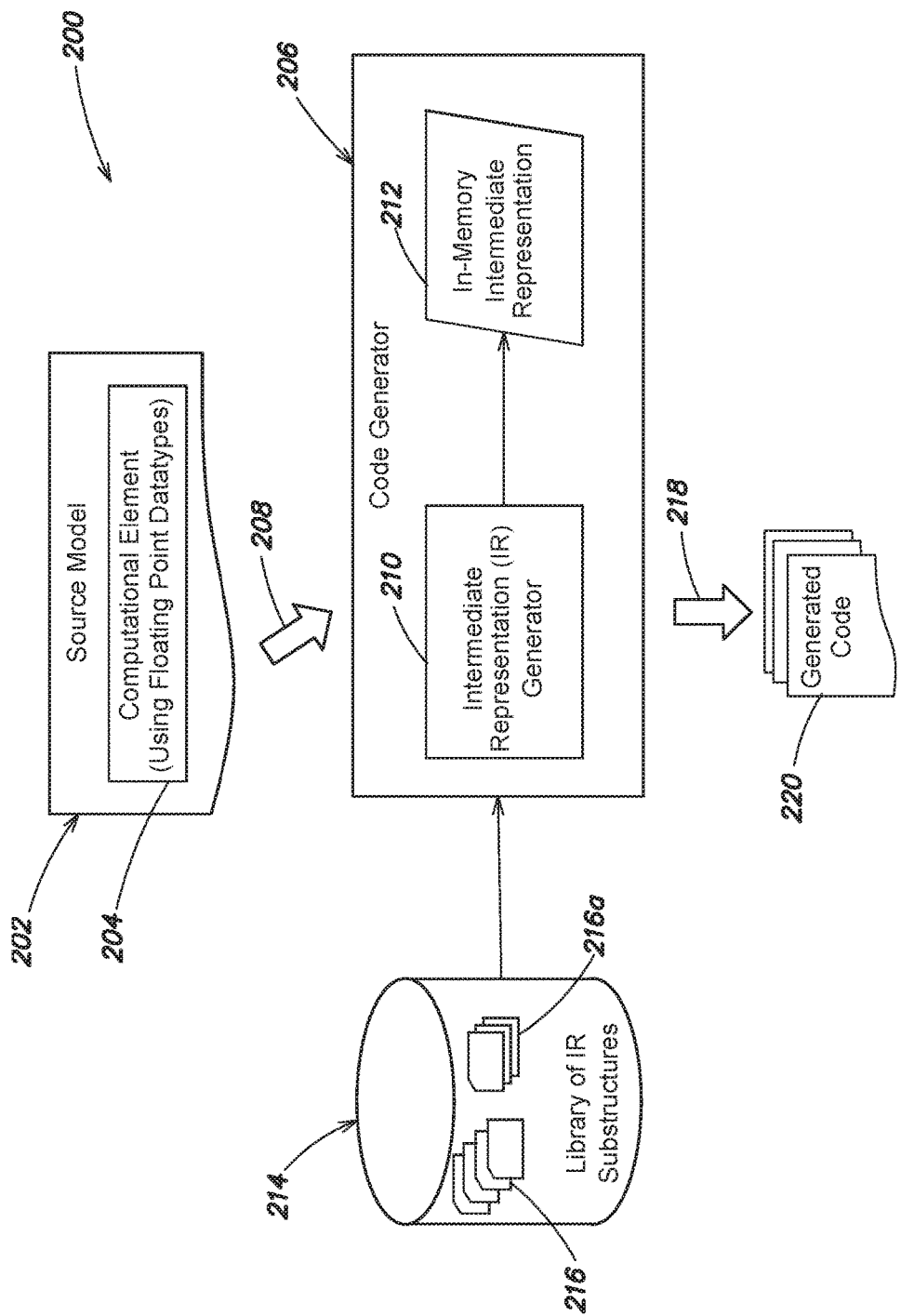
FIG. 2 is a schematic illustration of an example code generation environment in accordance with an embodiment.

FIG. 2 is a schematic illustration of an example code generation environment 200. The environment 200 may include an executable source model 202. The executable source model 202 may include a computational element 204. The computational element 204 may perform functionality on or with a numeric input value having a floating point data type, and may produce a numeric output value having the floating point data type. The computational element 204 may implement floating point arithmetic. The numeric input and output values may be stored in the form of floating point data types, and interpreted as integers and decomposed as a sign, an exponent, and a mantissa. The model 202 may be accessed by a code generator 206, as indicated by arrow 208. An intermediate representation generator 210 may create one or more in-memory, intermediate representations (IRs) of the executable model 202, indicated at 212.

The code generator 206 may access a library 214 that may include predefined IR substructures designated at 216. The code generator 206 may retrieve a given IR substructure 216a from the library 214. The given IR substructure 216a may implement functionality equivalent to the functionality of the computational element 204 of the model 202. The given IR substructure 216a, however, may use Boolean, integer and/or fixed-point data types instead of floating point data types. For example, the given IR substructure 216a may implement integer arithmetic. In addition, the given IR substructure 216a may reinterpret the input value(s) to the computational element 204 from a floating point data type format to integer and decompose the bit sequence into sign (S), exponent (E), and mantissa (M), which may be represented in integer, fixed point, or Boolean data type formats. The given substructure 216a also may compose or assemble the sign (S), exponent (E), and mantissa (M) output value(s) of the computational element 204 into a single word, and reinterpret the format, e.g., from integer, to a floating point data type format. The code generator 206 may include the given IR substructure 216a in the IR 212 generated for the model 202.

As indicated by arrow 218, the code generator 206 may generate code 220 for the model 202. The code generator 206 may utilize the IR 212, which includes the given IR substructure 216a, to generate the code 220. The generated code 220 may implement the algorithmic behavior of the model 202. The generated code 220 may be in a form capable of being executed (or utilized) outside of the modeling environment. For example, the generated code 220 may be Hardware Language Description (HDL) code, and may be used to synthesize a programmable logic device.

Figure 3:
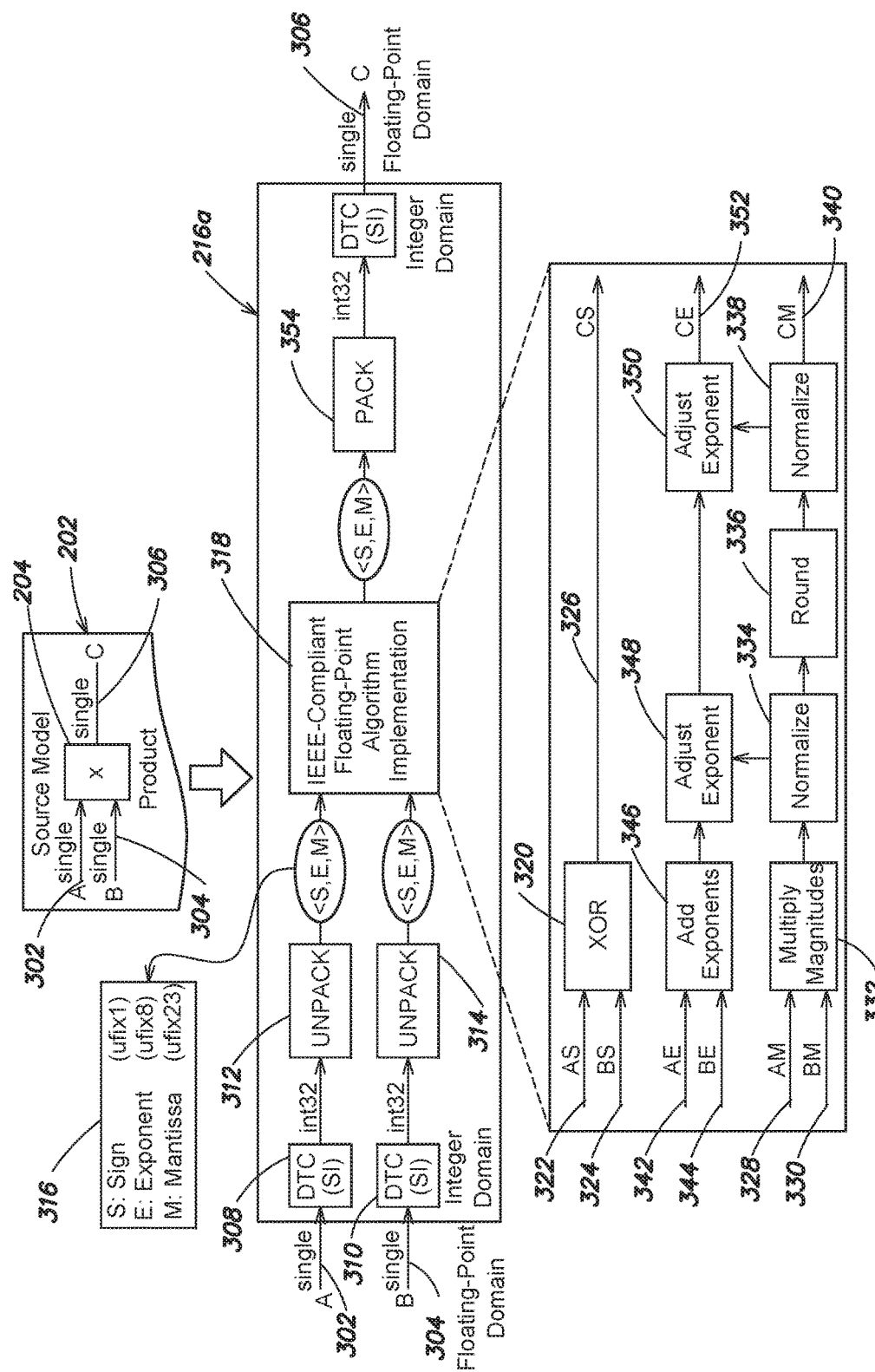
FIG. 3 is a schematic illustration of an example Intermediate Representation (IR) substructure in accordance with an embodiment.

FIG. 3 is a schematic illustration of the IR substructure 216a in accordance with an embodiment. For example, the executable source model 202 may be a block diagram model, and the computation element 204 may be a product block. The product block 204 may receive two input signals 302 and 304 representing input values A and B, and produce an output signal 306 representing an output value C that is the product of the input values A and B. The input signals 302 and 304, and the output signal 306 may have a single precision floating point data type. For each input signal 302 and 304 the IR substructure 216a may include respective input conversion elements 308 and 310 that reinterpret the input values A and B of the input signals 302 and 304 from single precision floating point data types to integer data types, such as 32-bit integer (int32) data types. The input conversion elements 308 and 310 may implement functionality of Data Type Conversion blocks of the Simulink® model-based design environment set to 'Stored Integer' mode in which the block preserves the raw bit pattern of the input value, sometimes referred to as the stored integer value, of the input. The raw stored integer bits in a single precision operator may be read, and reinterpreted as, for example, a 32-bit stored integer, from which the S,E,M components may be extracted to be operated on.

The input conversion elements 308 and 310 may mark the transition between a floating point domain, e.g., of the model 202, and an integer domain, e.g., of the IR substructure 216*a*.

The IR substructure 216*a* also may include unpack components 312 and 314 for each of the input signals reinterpreted as integers. The unpack components 312 and 314 may decompose, e.g., extract or slice, the sign (S), exponent (E), and mantissa (M) values from the received integer input, and may output the extracted sign, exponent, and mantissa values as separate outputs. As indicated at the legend 316, the sign (S) may be an unsigned fixed-point data type with a word length of one and zero fraction length (ufix1). The exponent (E) may be an unsigned fixed-point data type with a word length of eight and zero fraction length (ufix8). The mantissa (M) may be a fixed-point data type with a word length of 23 and zero fraction length (ufix23). In other embodiments, one or more of the individual sign (S), exponent (E), and mantissa (M) values may be stored as integer data types.

The IR substructure 216*a* may include an algorithmic component 318 that performs the operation, e.g., multiply, using the separate sign (S), exponent (E), and mantissa (M) input values, and produces separate sign (S), exponent (E), and mantissa (M) output values. The operations performed by the algorithmic component 318 on the individual sign (S), exponent (E), and mantissa (M) fixed point or integer values may be computationally equivalent to the floating point multiply operation of the product block 204. In other words, Result=A×B=operations performed by the algorithmic component 318 on AS, BS, AE, BE, AM, and BM.

In some embodiments, the algorithmic component 318 may be designed to comply with one or more standards, such as the IEEE 754 standard. The algorithmic component 318, as illustrated in the lower portion of FIG. 3, may include an XOR element 320 that performs an XOR Boolean operation on the two sign (S) input values 322 and 324 (AS and BS), and produces a sign (S) output value 326 (CS). For the two mantissa (M) input values 328 and 330 (AM and BM), the algorithmic component 318 may include a multiply element 332 that multiplies the two mantissa (M) input values, a normalize element 334 that normalizes the output of the multiply element 332, a round element 336 that performs one or more rounding operations on the output of the normalize element 334, and a normalize element 338 that normalizes the output of the round element 336 to produce a mantissa (M) output value 340.

For the two exponent (E) input values 342 and 344 (AE and BE), the algorithmic component may include an add element that adds the two exponent (E) input values, an adjust element 348 that adjusts the output of the add element 346 as a function of the output of the normalize element 334, and an adjust element 350 that adjusts the output of the adjust element 348 as a function of the output of the normalize element 338 to produce the exponent (E) output value 352.

The operations performed by the XOR element 320, Add element 346, adjust elements 348 and 350, multiply element 332, normalize elements 334 and 338, and round element 336 may comply with the IEEE 754 standard.

The IR substructure 216*a* may include a pack element 354 that receives the separate sign (S), exponent (E), and mantissa (M) output values 326, 352, and 340 of the algorithmic component 318, and assembles them into a single output value. The pack element 354 also may assemble or compose the sign (S), exponent (E), and mantissa (M) output values 326, 352, and 340 into a single word or bit sequence. In some embodiments, the sign (S), exponent (E), and mantissa (M) may be integers. The pack element 354 may perform a bitwise concatenation operation.

The IR substructure 216*a* may include an output conversion element 356 that reinterprets the output value C computed by the algorithmic component 318 from a 32-bit integer (int32) data type to a single precision floating point (single) data type. The output conversion element 356 also may implement functionality of a Data Type Conversion block of the Simulink® model-based design environment set to 'Stored Integer' mode. The output conversion element 356 may mark the transition between the integer domain, e.g., of the IR substructure 216*a*, and the floating point domain, e.g., of the model 202.

Because the IR 212 created for the executable model 202 and used in the code generation process includes the given IR substructure 216*a*, the generated code may include Boolean, integer, and/or fixed-point data types, but not floating point data types. Accordingly, the target hardware device on which the generated code 220 is deployed does not require a Floating Point Unit (FPU). Nevertheless, the systems and methods of the present disclosure do not require modifications be made to the executable source model 202. For example, the code generator 206 can generate integer equivalent code directly from the executable model 202 having floating point data types. There may be no requirement with the present disclosure to replace the floating point computational element 204 of the executable model 202 with fixed-point or integer computational elements. Instead, the executable model 202 having floating point data types may be received directly into the code generator 206, and code 220 suitable for configuring a programmable logic device, such as HDL code, may be produced.

Additionally, the integer equivalent code generated by the systems and methods of the present disclosure may be target-independent. For example, the generated code 220 may not include or be generated from custom primitives or IP blocks designed for a particular programmable logic device. Furthermore, the generated code 220, including the portions generated from the IR substructures 216, may be in a human-readable form.

The reinterpretation and decomposition of a stored value from a floating point format to three integer values for sign (S), exponent (E), and mantissa (M) may be local to a computational element, such as a model element of a model. One or more other model elements of the model may be left as operating on values stored as floating point formats.

In some embodiments, computational elements operating on values stored as fixed point formats and other computational elements operating on values stored as floating point formats may be logically organized into groups. Data may be converted and exchanged between the groups. IR substructures 216 may be utilized in an IR for the computational elements operating on values stored as floating point formats.

Figure 4:
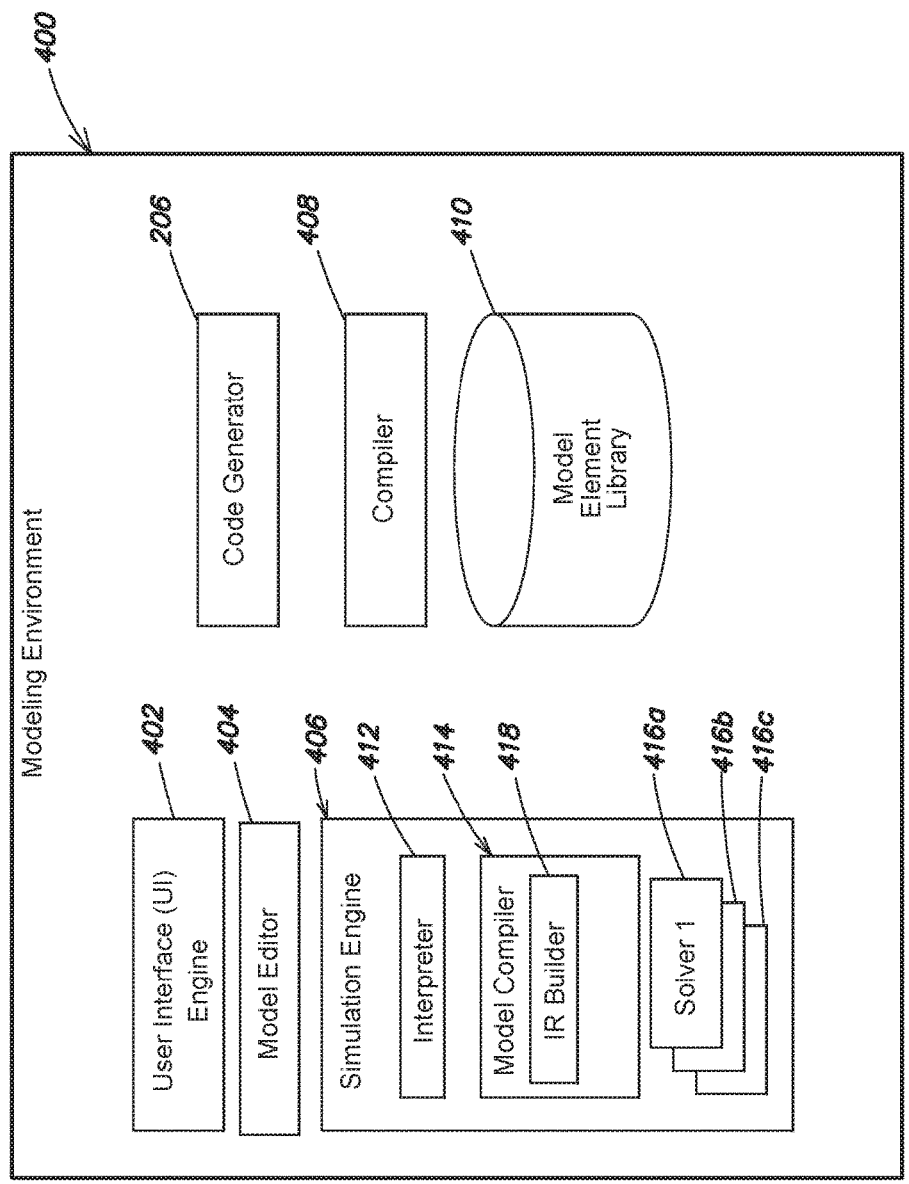
FIG. 4 is a schematic illustration of an example modeling environment in accordance with an embodiment.

FIG. 4 is a schematic illustration of a modeling environment 400 in accordance with an embodiment. The modeling environment 400 may include a User Interface (UI) engine 402, a model editor 404, a simulation engine 406, the code generator 206, a compiler 408, and a model element library 410. The UI engine 402 may create and present one or more User Interfaces (UIs), such as Graphical User Interfaces (GUIs) and/or Command Line Interfaces (CLIs), on a display of a workstation or other data processing device running the modeling environment 400. The one or more GUIs and/or CLIs may be operated by users to perform various modeling tasks, such as opening, creating, editing, and saving models, such as the computer-generated, executable model 202. The GUIs and/or CLIs may also be used to enter commands, set values for parameters and properties, run models, change model settings, etc. The model editor 406 may perform selected operations, such as open, create, edit, and save, in response to user inputs. The model element library 410 may include a plurality of model element types, and model elements of selected types may be selected from the library 408 and added to a model during model creation or editing.

The simulation engine 406 may include an interpreter 412, a model compiler 414, and one or more solvers, such as solvers 416a-c. The model compiler 414 may include one or more Intermediate Representation (IR) builders, such as IR builder 418. The simulation engine 406 may generate execution instructions for a model, and execute, e.g., compile and run or interpret, the model. Simulation of a model may include generating and solving a set of equations, and may involve one or more of the solvers 416a-c. Exemplary solvers include one or more fixed-step continuous solvers, which may utilize integration techniques based on Euler's Method or Heun's Method, and one or more variable-step solvers, which may be based on the Runge-Kutta and Dormand-Prince pair.

As noted, the code generator 206 may generate code 220 for an executable model or portion thereof automatically. The generated code 220 may be source code or object code suitable for execution outside of the modeling environment 400, and may be referred to as standalone code. To the extent the generated code 220 is source code, the compiler 408 may compile the source code into object code for execution by a target platform. The generated source code may conform to a selected programming language.

Suitable modeling environments include the MATLAB® programming system and the SIMULINK® model-based design system from The MathWorks, Inc. of Natick, Mass., the LabVIEW programming system from National Instruments Corp. of Austin, Tex., the MatrixX modeling environment from National Instruments Corp., the Visual Engineering Environment (VEE) from Agilent Technologies, Inc. of Santa Clara, Calif., a Unified Modeling Language (UML) system, a Systems Modeling Language (SysML) system, and System Generator from Xilinx, Inc., among others.

Models constructed within the modeling environment 402 may include textual models, graphical models, such as block diagrams, and combinations thereof. A model may be a high-level functional or behavioral model. A model may be executed in order to simulate the system being modeled, and the execution of a model may be referred to as simulating the model. For example, a model editor window presented on a display may include a Run command button that may be selected by a user to execute a model. Alternatively, a user may enter a run command in a CLI. In response to the user selecting the Run button or entering the run command, the simulation engine 410 may execute the model, and may present the results of the model's execution to the user, e.g., on the model editor window or some other display.

Suitable models include Simulink models, MATLAB models, Simscape models, Stateflow models, Modelica models, Unified Modeling Language (UML) models, LabVIEW block diagrams, MatrixX models, and Agilent VEE diagrams.

The GUI generated by the UI engine 404 also may include a Code Generation command button that may be selected by the user. Alternatively, the user may enter a code generation command in the CLI. In response to the user selecting the Code Generation button or entering the code generation command, the code generator 206 may generate code for at least a portion of an identified model.

Figure 5:
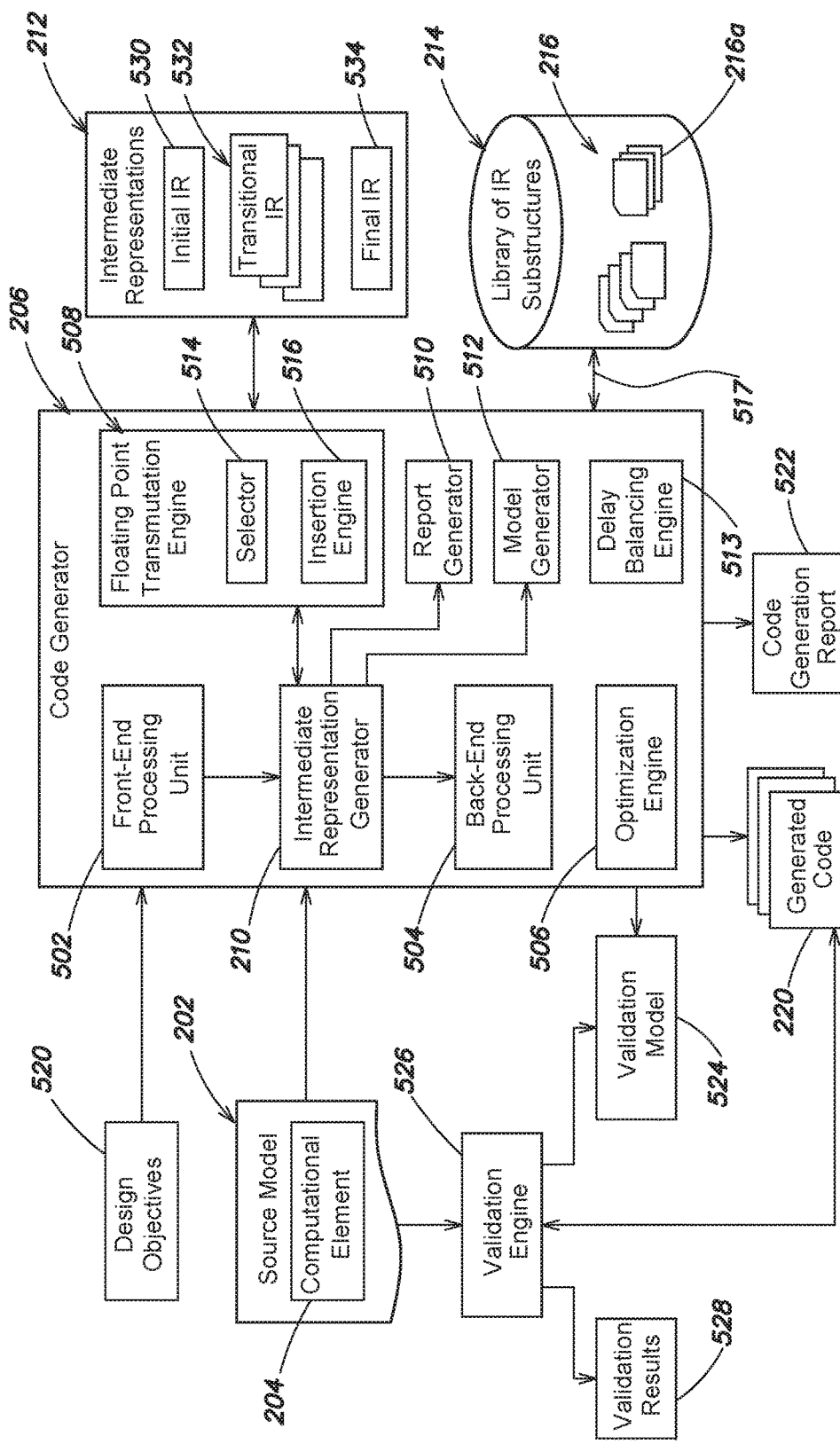
FIG. 5 is a schematic illustration of an example code generator in accordance with an embodiment.

FIG. 5 is a schematic illustration of the code generator 206 in accordance with an embodiment. The code generator 206 may include a front-end processing unit 502, the IR generator 210, a back-end processing unit 504, an optimization engine 506, a floating point transmutation engine 508, a report generator 510, a model generator 512, and a delay balancing engine 513. The floating point transmutation engine 508 may include a selector 514 and an insertion engine 516. The code generator 206 may include or have access to, e.g., be in communication with, the library 214 of IR substructures 216, as indicated by arrow 517.

The code generator 206 may access the source model 202 having the computational element 204. In some embodiments, the code generator 206 also may receive one or more design objectives, as indicated at 520. The code generator 206 may generate the code 220 for the model 202. For example, in some implementations, the generated code 220 may include HDL code that is bit true and cycle accurate (modulo a well-defined initial latency) to the model 202. In other implementations, the generated code may comply with a standard, such as the IEEE 754 standard. Exemplary code that may be generated includes C code, C++ code, Hardware Description Language (HDL) code, VHSIC Hardware Description Language (VHDL), Verilog code, SystemVerilog code, Programmable Logic Controller (PLC) code that complies with IEC 61131-3 standard, Register Transfer Level (RTL) code, assembly code, executable binary code, SystemC code, and vendor or target specific HDL code, such as Xilinx FPGA libraries. In some embodiments, the code generator 206 may generate embedded MATLAB code. The generated code 220 may be output in the form of a build or other file, and may be stored in memory. The code generation report 522 also may be in the form of a file, such as an HTML and/or XML file, and may be presented on an output device, such as a display or a printer.

The report generator 510 may produce one or more code generation reports 522, such as a hardware resource utilization report or a timing diagram, among others.

As noted, the IR generator 210 may construct one or more in-memory intermediate representations (IRs) 212 of the model 202. In some embodiments, the IR generator 210 may construct an initial IR 530 that may closely correspond to the executable source model 202. For example, the structure of the initial IR 530 may closely correspond to the structure of the model 202, where model elements map one-to-one to nodes of the initial IR 530, and arrows or lines of the model 202 map one-to-one to edges of the initial IR 530. The initial IR 530 also may include information for presenting a visual display of the model 202, for example, in the form of a block diagram model, on a display device of a workstation or data processing device.

The IR generator 210 may apply one or more transforms, starting with the initial IR 530, resulting in the generation of a plurality of transitional IRs, indicated generally at 532, and ending with a final IR 534. The process of transforming the initial IR 530 through the transitional IRs 532 and to the final IR 534 may be referred to as elaboration or lowering. The transitional and final IRs 532 and 534 may have structures that differ, possibly significantly, from the structure of the model and from the initial IR 530.

The model generator 512 may produce one or more executable verification and/or validation models, such as verification and/or validation model 524, from one or more of the IRs 212. The executable source model 202, the validation model 530, and the generated code 220 may be received by a validation engine 526, which may be part of the modeling environment 400. The validation engine 526 may compare the generated code 220 to the source model 202 and/or the verification and/or validation model 524, and may generate validation results 528. A user may evaluate the verification and/or validation results to determine whether the behavior of the generated code 220 is equivalent to the behavior of the source model 202 and/or the verification and/or validation model 524, for example within an acceptable tolerance level.

The code generator 206 may comprise registers and combinational logic configured and arranged to produce sequential logic circuits. In some embodiments, the code generator 206 may be implemented through one or more software modules or libraries containing program instructions pertaining to the methods described herein, that may be stored in memory and/or on computer readable media, and may be executed by one or more processors. Other computer readable media may also be used to store and execute these program instructions. In alternative embodiments, various combinations of software and hardware, including firmware, may be utilized to implement the present invention.

The library of IR substructures 214 may be implemented through one or more data structures, such as linked lists, tables, databases, etc. stored in memory.

It should be understood that the modeling environment 400 and the code generator 206 of FIGS. 4 and 5 are intended for illustrative purposes, and that the modeling environment 400 and/or the code generator 206 may be implemented in other ways and/or with other or additional elements. For example, in some embodiments, the code generator 206 may not include an IR generator, and may instead coordinate with the simulation engine 406 and the IRs constructed by the IR builder 418 of the model compiler 414. In some embodiments, the code generator 206, or one or more components thereof, may be separate from the modeling environment 400. The code generator 206 may be in communication with the modeling environment 400 through local procedure calls (LPCs), remote procedure calls (RPCs), or one or more Application Programming Interfaces (APIs).

Suitable code generators for use with the present invention include, but are not limited to, the Simulink Coder, the Embedded Coder, the Simulink PLC Coder, and the Simulink HDL Coder products from The MathWorks, Inc. of Natick, Mass., and the TargetLink product from dSpace GmbH of Paderborn Germany. Nonetheless, other code generation systems and other compilers may be used.

Figure 6A:
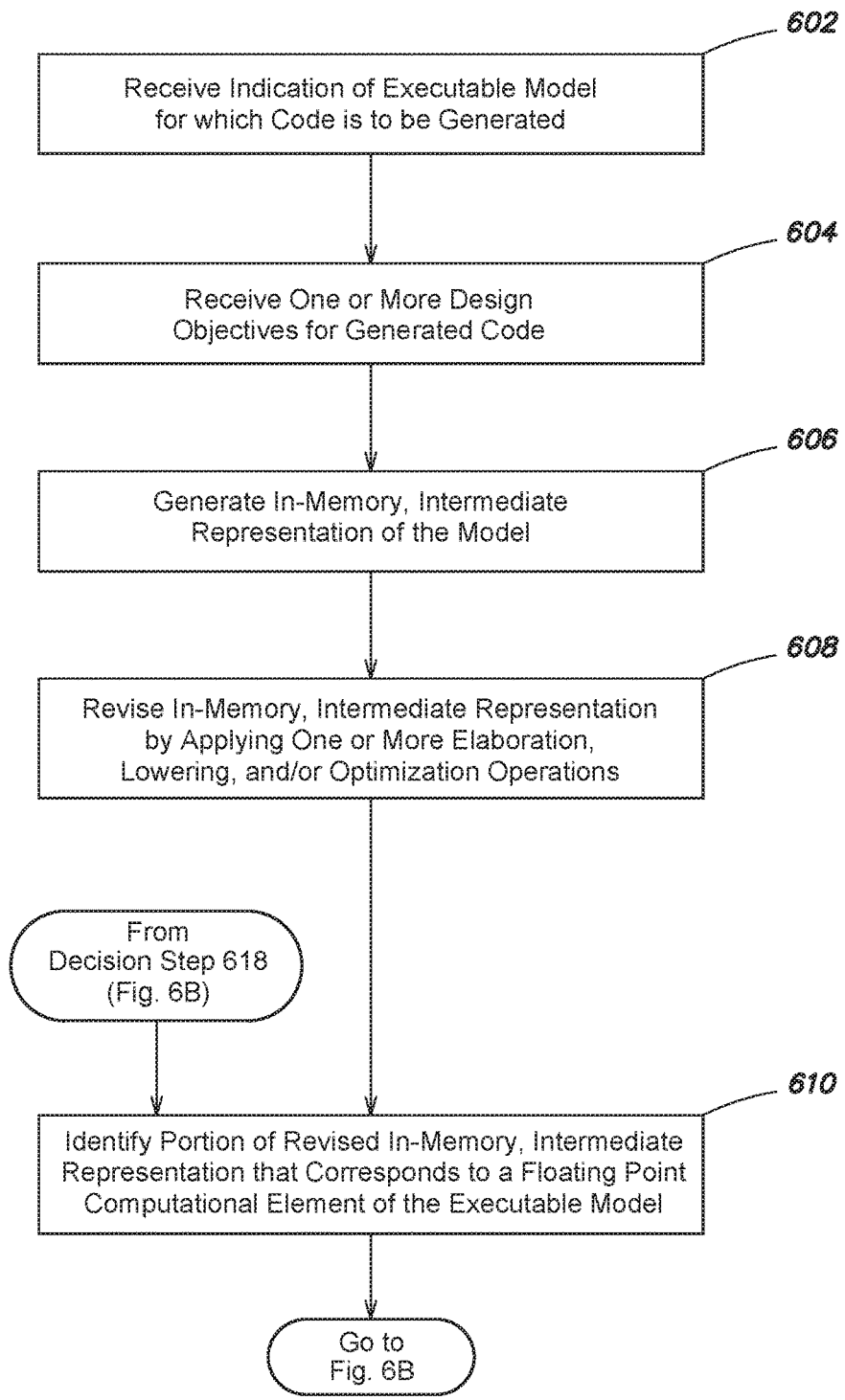
FIGS. 6A-6C are partial views of a flow diagram of an example method in accordance with an embodiment.
Figure 6B:
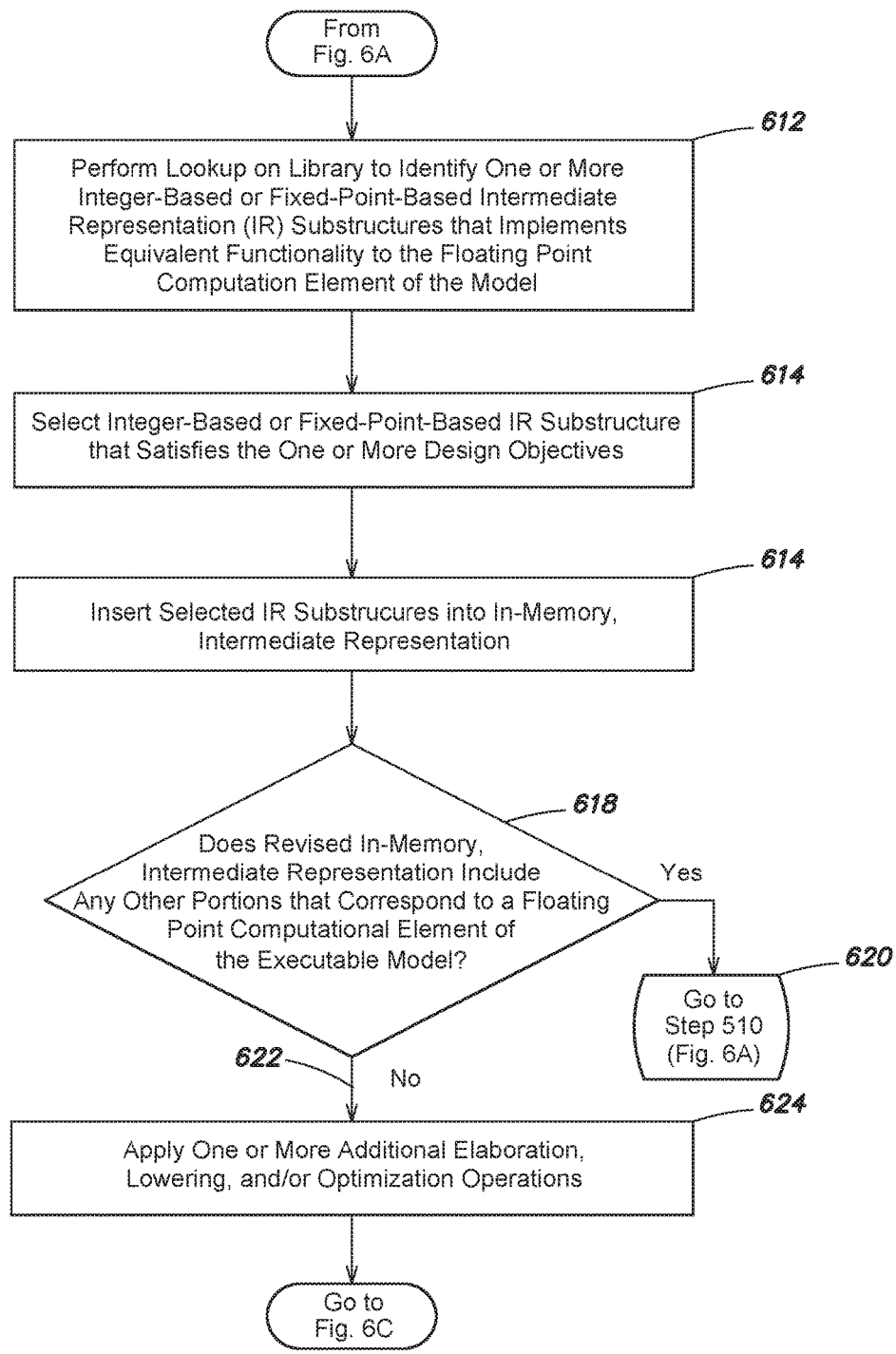
Figure 6C:
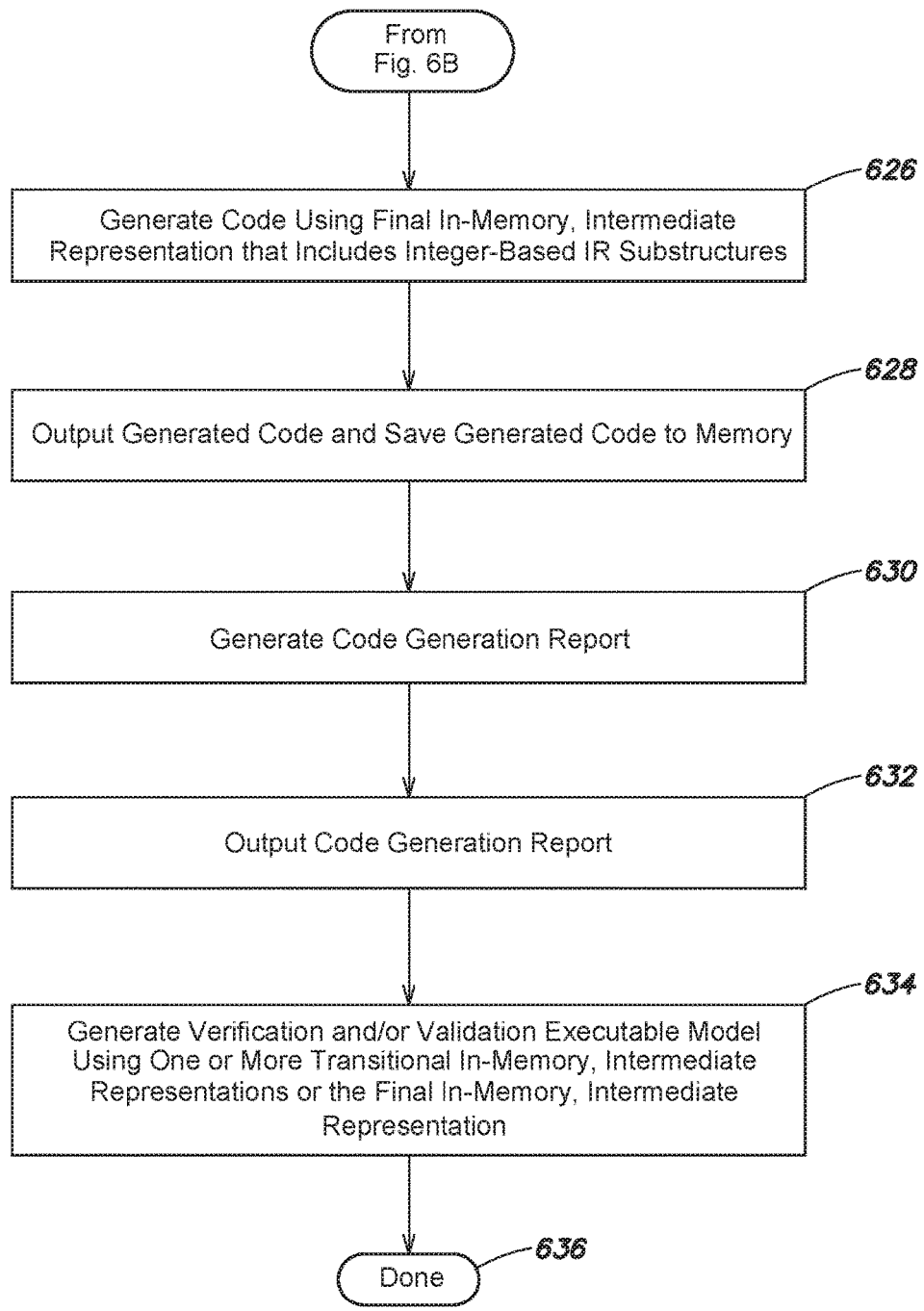

FIGS. 6A-6C are partial views of a flow diagram of a method in accordance with an embodiment. An executable model, such as the model 202, or a portion thereof may be received by or identified to the code generator 206, as indicated at step 602. The code generator 206 also may receive one or more design objectives for the code to be generated from the model 202, as indicated at step 604. The design objectives may include one or more hardware performance constraints on a hardware implementation of the model 202. Exemplary hardware performance constraints include timing, area, and/or power consumption. For example, a timing constraint may relate to the clock speed at which the target programmable logic device is to operate, such as 200 MHz, 500 MHz, 1 GHz, etc. The timing constraint may be specified globally for the target programmable logic device. Alternatively, the timing constraint may be specified in connection with a particular data path through the model 202. An area constraint may specify a maximum number of logic elements, such as Lookup Tables (LUTs), Multipliers, Registers, Logic Slices, Digital Signal Processors (DSPs), Random Access Memory (RAM) blocks, or Intellectual Property (IP) blocks, among others. A design constraint may include a user opting for more reduced area in FPGA/ASIC, and compromising last bit of accuracy. A power constraint may specify a maximum power consumption for the target programmable logic device. In some implementations, the design objections also may include an identity of a particular type of programmable logic device to which the generated code is to be deployed. For example, the design objectives may include the particular product or family name of a specific Field Programmable Gate Array (FPGA).

The one or more design objectives may be user specified. For example, the UI engine 402 may present a GUI or CLI having one or more graphical affordance. A user may enter a desired hardware performance constraint through the one or more graphical affordances. For example, the UI engine 402 may generate a dialog or properties page, and include one or more controls through which the user can select or specify options, such as the identification of the model 202 or one or more subsystems or other portions of the model 202 for which code generation is to be performed, and other design objectives. It should be understood that the UI engine 402 may additionally or alternatively present a Command Line Interface (CLI) through which a user may identify the model 202 or portions thereof, and specify the one or more design objectives.

The code generator 206 may generate the code 220 automatically for the identified model 202 or portions thereof. Several stages may be involved in generating the code 220 for the model 202. For example, the front-end processing unit 502 may perform a number of preliminary tasks, such as analyzing the syntax and semantics of the model 202, performing error detection and reporting, capturing dataflow relationships, determining block semantics, such as the type of block, determining particular block and/or subsystem parameter settings, e.g., as established by the user, etc. This information may be provided by the front-end processing unit 502 to the IR generator 210.

The IR generator 210 may generate a series of IRs designated generally at 212 based on the source model 202. For example, the IR generator 210 may construct the initial IR 530, as indicated at 606. The IR generator 210 may then perform a series of transforms starting with the initial IR 530, and working through the plurality of transitional IRs 532, as indicated at step 608. The transforms may include elaboration, lowering, and/or optimization operations. Optimization operations may be applied to the IRs by the optimization engine 506. Exemplary transforms include procedure in-lining, loop transformations, global and local optimizations, register allocation, and target-dependent optimizations. Exemplary optimizations include resource sharing, streaming, pipelining, and RAM mapping of Look-up Tables (LUTs), among others. For example, a model may include a filter or other high-level model element. One or more of the IRs may include elements corresponding to the filter. During the lowering operations, the portion of the IR corresponding to the filer may be replaced with portions corresponding to core components that form the filter, such as multiply, add, accumulate, delay, etc.

In some embodiments, one or more of the initial IR 530 and the transitory IRs 532 may be graph-based, object-oriented structures. For example, one or more of the IRs may be in the form of a hierarchical, Data Flow Graph (DFG), or in the form of a Parallel Intermediate Representation (PIR), which has a plurality of IR objects, including nodes interconnected by edges. The nodes of the PIR represent blocks from the designated model or portions thereof in an abstract manner. The edges of the PIR represent the connections between the blocks of the model. Special nodes, called network instance components (NICs), provide hierarchy in the PIR, for example, by abstractly representing subsystems of the model 202. For example, each model element of the model 202 may map to one or more nodes of the PIR, and each connection element of the model 202 may map to one or more edges of at least the initial PIR 530.

In some implementations, one or more serial IRs may be used in addition to or in place of the PIRs.

In some embodiments, at least the initial IR 530 may have a plurality of hierarchically arranged levels. For example, the initial IR 530 may be a top-level of the in-memory representation of the source model 202, and one or more of the components of the initial IR 530 may be a particular type or form of in-memory representation. For example, one or more nodes of the initial IR 530 may a Control Flow Graph (CFG), Control Data Flow Graph (CDFG), program structure tree (PST), abstract syntax tree (AST), etc. A CDFG may capture the control flow as well as the data flow of a graphical model through data dependency and control dependency edges. The initial IR 530 and one or more of the transitional IRs 532 may be saved to memory, such as a main memory or a persistent memory of a data processing device. Additionally or alternatively, one or more IR snapshots may be taken during the elaboration, lowering, and/or optimization procedures.

The floating point transmutation engine 508 may parse and/or evaluate one or more of the IRs 212, and may identify the portion of the IR 212 that corresponds to a computational element of the source model that uses floating point data, as indicated at step 610. For example, the floating point transmutation engine 508 may identify portions of the IR 212 that receive floating point input data, generate floating point output data, and/or perform one or more floating point operations, such as a floating point arithmetic operations. The selector 514 may perform a lookup on the library of IR substructures 214, and may identify one or more integer-based or fixed-point-based IR substructures 216 from the library 214 that are equivalent to the computational element that uses floating point data, as indicated at step 612 (FIG. 6B). For example, if the source model (and thus an IR 212) includes a model element that performs an Add operation using floating point arithmetic, the selector 514 may locate one or more IR substructures 216 in the library 214 that perform an Add operation using integer arithmetic.

If the code generator 206 received one or more design objectives, the selector 514 may choose a particular IR substructure 216 from the library 214 to satisfy the one or more design objectives, as indicated at step 614. For example, a user may mark a portion of a model, such as a sub-model, a subsystem, or other component or a region, as requiring a high-frequency implementation. The library of IR substructures 214 may include multiple IR substructures 216 for a given operation, e.g., Add, Multiply, Sine (Sin), Cosine (Cos), etc. The different IR substructures 216 may be optimized for a given hardware characterization, such as area, time, and/or power. If a computational element of a model is marked as requiring high-frequency, the selector 514 may choose the particular IR substructure 216 that is optimized for time.

Furthermore, a design objective may identify a particular target programmable logic device for the generated code 220. The multiple IR substructures 216 available for a given operation may also include IR substructures 216 that are optimized for particular target programmable logic devices. When replacing portions of the IR 212 corresponding to floating point operators, the selector 514 may choose IR substructures 216 optimized for the target programmable logic device identified as one of the design objectives.

The insertion engine 516 may insert the IR substructure 216 retrieved from the library 214 into the IR 212, as indicated at step 616. The floating point transmutation engine 508 may determine whether the IR 212 being analyzed includes another portion that operates on floating point data, as indicated at decision step 618. If so, processing may return to step 610, as indicated by Yes arrow 620. Steps 610-616 may be repeated for the additional IR portion that involves floating point data. In some embodiments, whether to replace portions of the IR with IR substructures may be user-guided.

If the IR 212 being analyzed does not include an additional portion that involves floating point data, the IR generator 210 may perform one or more additional elaboration, lowering, and/or optimization operations on the IR 212 following the insertion of the IR substructures 216, as indicated by No arrow 622 leading to step 624. The additional elaboration, lowering, and/or optimization operations may result in the creation of the final IR 534. The IR generator 210 may provide the final IR 534 to the back-end processing unit 504, which may generate the code 220 for the model 202, as indicated at step 626 (FIG. 6C).

Because the floating point operators of the source model 202 have been replaced, the generated code 220 may not include data having floating point data types or perform floating point operations. Instead, the generated code 220 may include only Boolean, integer and/or fixed-point data types and operators.

The code generator 206 may output and save the generated code 220, as indicated at step 628. For example, the generated code 220 may be presented on a display of a workstation and/or printed. It may also be saved to memory.

The report generator 510 may generate the code generation report 522, as indicated at step 630. The report generator 510 may output the code generation report 522, as indicated at step 632.

In some embodiments, in addition to generating code or alternatively, the IR builder 418 of the model compiler 414 may create or it may access one or more of the in-memory intermediate representations constructed for a model in which floating point data types are interpreted as Boolean, integer and/or fixed-point data types. The interpreter 412 and/or the model compiler 414 may utilize the one or more in-memory intermediate representations to generate execution instructions for the model. In some embodiments, the execution instructions may be implemented as an in-memory representation. The simulation engine 406 of the modeling environment 400 may simulate the model or a portion thereof in a Sign-Exponent-Mantissa (S-E-M) mode by executing these execution instructions, for example on a data processing device, such as a host machine. The host machine may include a processor with a Floating Point Unit, or it may include a processor without a Floating Point Unit. A user may evaluate the results produced by simulating the model in S-E-M mode. For example, the user may compare the results produced by simulating the model in S-E-M mode, with results produced when simulating the model in a normal mode, where floating point data types of values are preserved and floating point operations performed. Such a comparison may verify numerical consistency in a model's computed results independent of the target platform. Numerical consistency may mean that equivalent results are computed whether the model is executed in a normal mode, the model is executed in an S-E-M mode, or code generated for the model is executed, where the generated code includes only Boolean, integer and/or fixed point data types and operators.

In some embodiments, the model generator 512 may generate the executable verification and/or validation model 524 from one or more of the IRs 212, as indicated at step 634. The verification and/or validation model 524 may be used in verification and/or validation testing. Verification testing may refer to determining whether a model meets requirements specified for the model, such as software requirements. Validation testing may refer to determining whether a model, when executed, operates as intended. Verification and validation may include verifying numerical consistency, for example by providing a comparison between the generated code 220 (or the code generation process) and the source model 202.

In some cases, replacing floating point operators in the IR 212 with one or more integer/fixed-point/Boolean operators, implemented through the IR substructures 216, may introduce latencies. More specifically, a model may include a plurality of paths, such as signal, data, control, mechanical, state transition, or other paths. Model paths may merge with each other at join points of the model, such as a particular model element. The introduction of latencies may result in a first path becoming misaligned in time relative to another path.

In an embodiment, the delay balancing engine 513 may analyze the IR 212 to identify paths that have become misaligned in time. The delay balancing engine 513 may automatically insert one or more delays in the IR 212, and may configure the inserted delays to return the paths back into time-wise alignment.

The IR 212, as modified to include the delays inserted by the delay balancing engine 513, may be provided to the model generator 512. The model generator 512 may automatically generate the verification and/or validation model 524 from the received IR 212. For example, the model generator 512 may create a block diagram model or a text-based model. The verification and/or validation model 524 produced by the model generator 512 may be presented to the user, e.g., on display 120. In some embodiments, the delays introduced by the delay balancing engine 513 may be presented in the verification and/or validation model 524 as respective delay blocks. The verification and/or validation model 524 may be executed and results produced during execution of the verification and/or validation model 524 may be compared by the validation engine 526 to results produced during execution of the source model 202 and/or the generated code 220. The comparison may be included in the validation results 528.

Processing may then be complete as indicated by Done step 636.

It should be understood that one or more of the steps may be optional. For example, steps 628-634 may be omitted and/or performed at a different time from the generation of code and by other entities and/or data processing devices.

Figure 7:
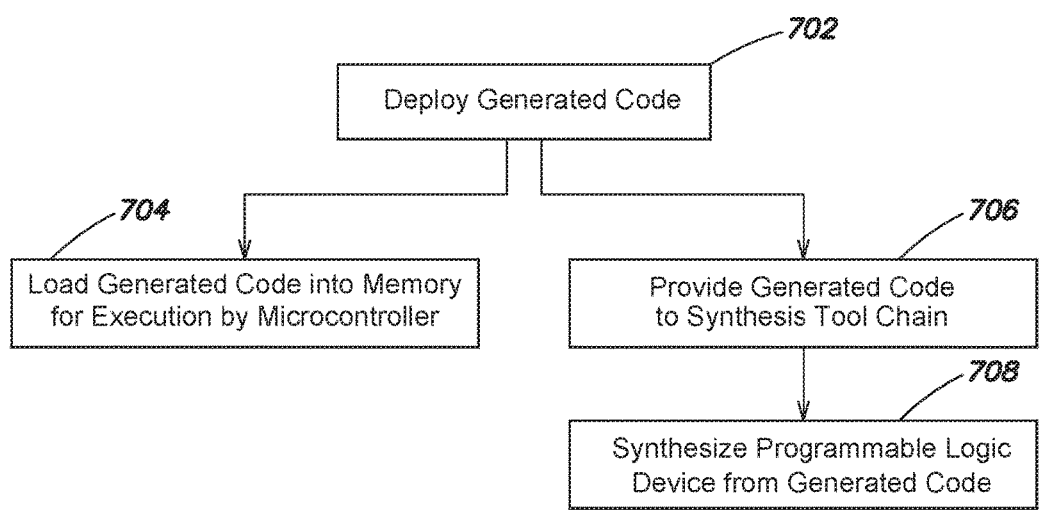
FIG. 7 is a flow diagram of an example method in accordance with an embodiment.

FIG. 7 is a flow diagram of a method in accordance with an embodiment. The generated code 220 may be deployed and run outside of the modeling environment 400, as indicated at step 702. For example, if the target system is an embedded device with a DSP, the generated code 220 may be compiled into an executable, and the executable may be stored in a memory of the embedded device and run by the DSP, as indicated at step 704. If the target system includes a programmable logic device, the generated code 220 may be provided to a synthesis tool chain, as indicated at step 706. The synthesis tool chain may use the generated code 220 to synthesize or configure the programmable logic device, as indicated at step 708. The synthesis tool chain may convert HDL code to a technology and target specific bitstream for configuring the target hardware element. To configure an ASIC, the synthesis tool chain may generate a target-specific, gate-level representation.

Exemplary synthesis tool chains include the Design Compiler from Synopsys, the Encounter RTL Compiler from Cadence, Quartus from Altera, XST from Xilinx, Precision RTL from Mentor Graphics, and Vivado Design Suite from Xilinx, among others.

Figure 8:
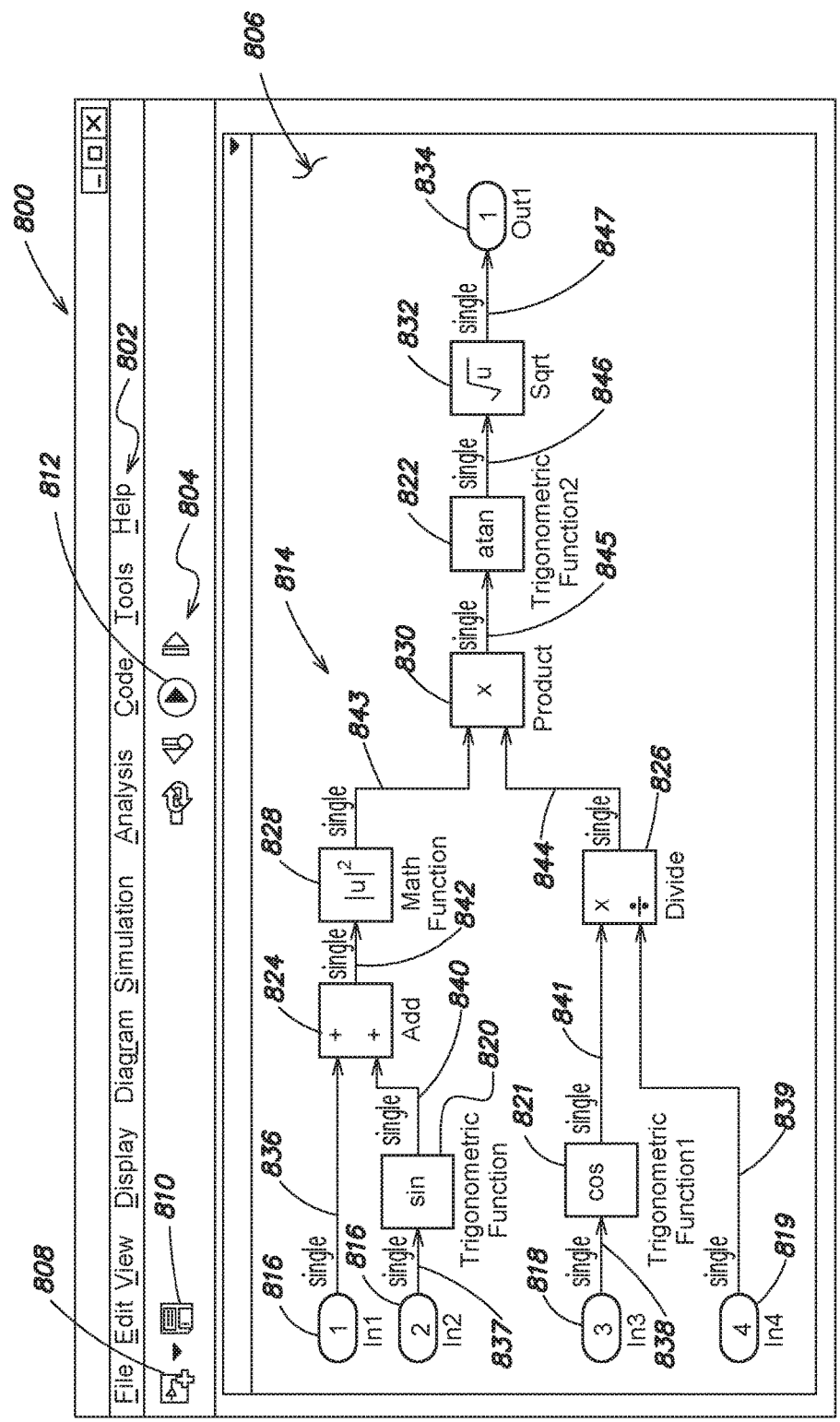
FIG. 8 is an illustration of a model editor window presenting an example graphical executable model in accordance with an embodiment.

FIG. 8 is a schematic illustration of a model editor window 800, which may be generated by the modeling environment 400, and presented on a display of a data processing system. The model editor window 800 may include a plurality of graphical affordances, such as user interface elements and/or windows elements (widgets), at least some of which may be operated by a user to construct, edit, run, and save a model, among other operations. For example, the model editor window 800 may include a menu bar 802, a toolbar 804, and a canvas 806. The menu bar 802 may include a plurality of commands, and the commands may be organized into drop-down categories, such as File, Edit, View, Display, etc. The toolbar 104 may include a plurality of graphical command buttons for executing frequently used commands. For example, the toolbar 804 may include a New button 808, a Save button 810, and a Run button 812, among others.

A user may select model element types from the model element library 410, and add instances of the selected model element types to the canvas 806 to construct or revise a model. The model may be a graphical, e.g., a block diagram, model, and at least some of the selected model elements may be graphical elements. A model may have portions operating according to different execution domains, such as a time-based or dynamic portion, a state-based portion, a dataflow based portion, a control flow portion, an event based portion, a message-based portion, etc.

A graphical model 814 having executable semantics may be opened and presented on the canvas 806. The model 814 may include a plurality of interconnected graphical elements. For example, the model 814 may include four Inport block 816-819 (labeled, In1, In2, In3, and In4), three Trigonometric Function blocks 820-822 configured to perform Sin, Cos, and A tan (arc tangent) operations, respectively, an Add block 824, a Divide block 826, a Math Function block 828 configured to perform a Power of 2 operation, a Product block 830, a Square Root block 832, and an Outport block 834 (labeled Out1).

The model elements may be interconnected by connection elements 836-847. Connection elements may represent different relationships between the connected model elements, for example depending on the modeling domain, e.g., dynamic or time-based, state-based, message-based, event-based, triggered, etc. For example, in a time-based modeling system, a connection element appearing as a single line arrow may represent a mathematical relationship, such as a signal, between two connected model elements where a first, e.g., source, mode elements updates the signal, and a second, e.g., sink, model element reads the signal. A signal may refer to a time varying quantity having one or more values for example at all points in time during model execution. For example, a signal may have a value at each time step during execution of a model. In other cases, connections elements may represent data and/or control flow, state transitions, events, messages, and/or mechanical relationships, such as power, among the model elements. Connection elements may have a graphical representation that indicates the type of connection.

The data type of the signals represented by the connection elements 836-847 may be single precision floating point, as indicated by the 'single' labels on the model 814. Model elements may have parameters, such as the gain value of a Gain block, the constant value of a Constant block, and the values for these parameters may have a single precision floating point data type.

The Power 2 Math Function model element 828 receives a floating point input signal, as indicated by connection element 842, and may generate a floating point output signal, as indicated by connection element 843. In addition, the Power 2 Math Function model element 828 may compute its output using floating point arithmetic. During a code generation process for the model 814, one or more IRs may be constructed. The IRs may start out representing data for the model 814 as single precision floating point data types. However, the selector 514 of the floating point transmutation engine 508 may identify and designate that portion of the IR corresponding to the Power 2 Math Function model element 828 for replacement with an IR substructure 216 that utilizes integer or fixed-point data types instead of single precision floating point data types.

Figure 9:
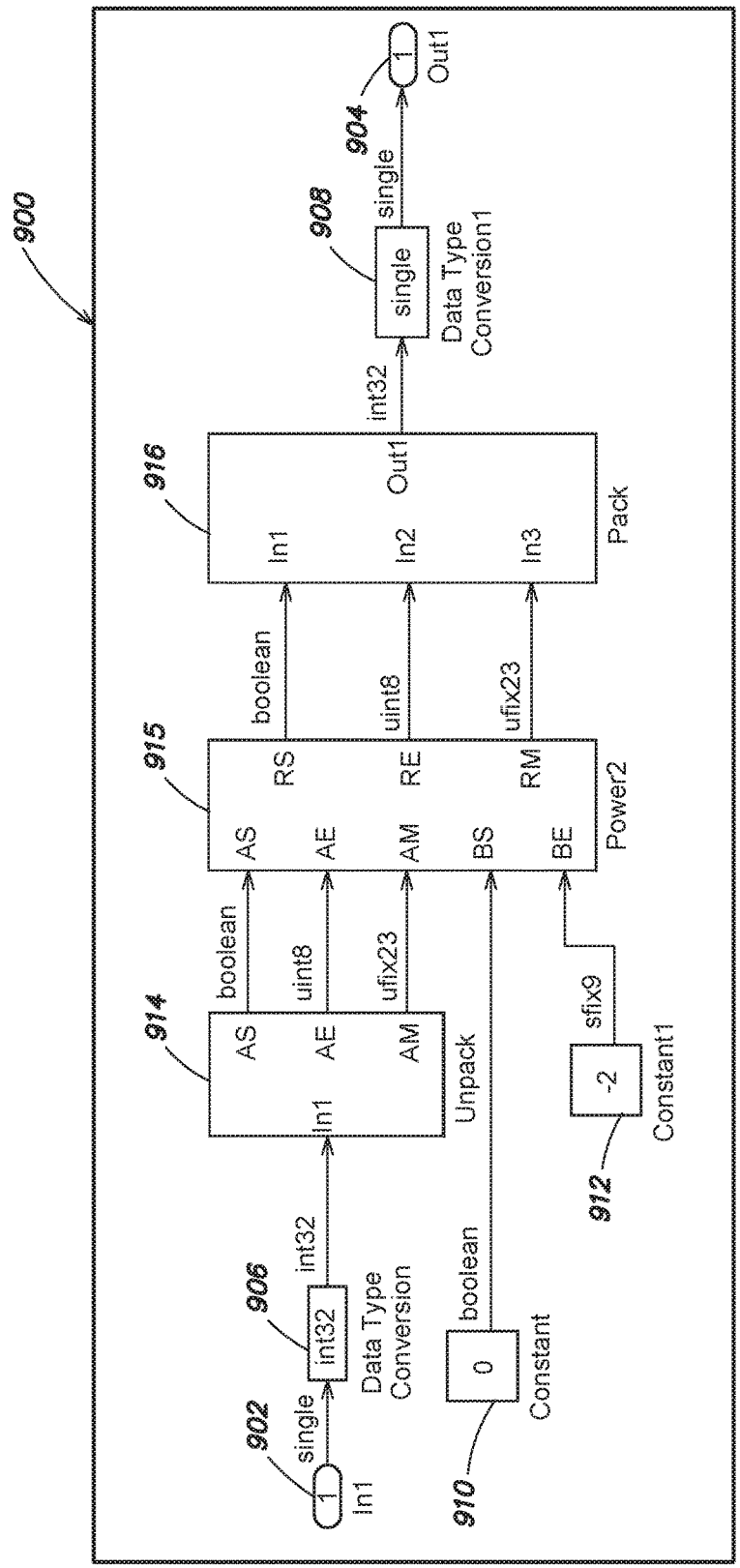
FIG. 9 is a schematic illustration of an example Intermediate Representation (IR) substructure in accordance with an embodiment.

FIG. 9 is a schematic illustration of an IR substructure 900 for the Power 2 Math Function model element 828. The IR substructure 900 utilizes boolean, integer and fixed-point data types instead of single precision floating point. For purposes of illustration, the IR substructure 900 is depicted in the form of a subsystem.

The IR substructure 900 includes an Inport block 902 that receives the single precision floating point input signal to the Power 2 Math Function model element 828, and an Outport block 904 that provides the single precision floating point output signal computed by the Power 2 Math Function model element 828. The IR substructure 900 further includes two conversion blocks 906 and 908 (labeled Data Type Conversion and Data Type Conversion1), two Constant blocks 910 and 912 (labeled Constant and Constant1), and three components 914-916 (labeled Unpack, Power2, and Pack).

The conversion block 906 reinterprets the data type of the input signal from single precision floating point to 32-bit integer. The conversion block 908 reinterprets the output signal from 32-bit integer to single precision floating point.

The conversion blocks 906 and 908 may be implemented using Data Type Conversion blocks of the Simulink® modeling environment set to 'Stored Integer' mode. Nonetheless, it should be understood that other model elements or combinations thereof that reinterpret floating point data types to integer or fixed point data types may be used.

The Unpack component 914 may receive a floating point input value (interpreted as an integer), and may extract the individual constituent parts of the floating point input value. For example, the floating point input value may include a sign (S), an exponent (E), and a mantissa (M). The Unpack component 914 may extract the sign (S), the exponent (E), and the mantissa (M), as separate values. The Unpack component 914 may output the sign value (AS) as a Boolean data type (boolean), the exponent value (AE) as an unsigned 8-bit integer data type (uint8), and the mantissa value (AM) as an unsigned fixed-point data type with a word length of 23 and zero fraction length (ufix23).

The Constant block 910 may output a constant value of 0 as a boolean data type, while the Constant block 912 may output a constant value of −2 as a signed fixed-point data type with a word length of 9-bits and zero fraction length (sfix9).

The Power2 component 915 computes the power 2 value for a floating point input where the input value is represented by its sign (S), exponent (E), and mantissa (M) values. The computed output of the Pow2_Single component 915 is also in terms of the output value's sign (S), exponent (E), and mantissa (M).

The Pack component 916 may receive the sign (S), exponent (E), and mantissa (M) output values computed by the Power2 component 915, and may assemble, e.g., concatenate, them as a single word or bit sequence. The output of the Pack component 916 may be provided to the conversion element 908.

Figure 10A:
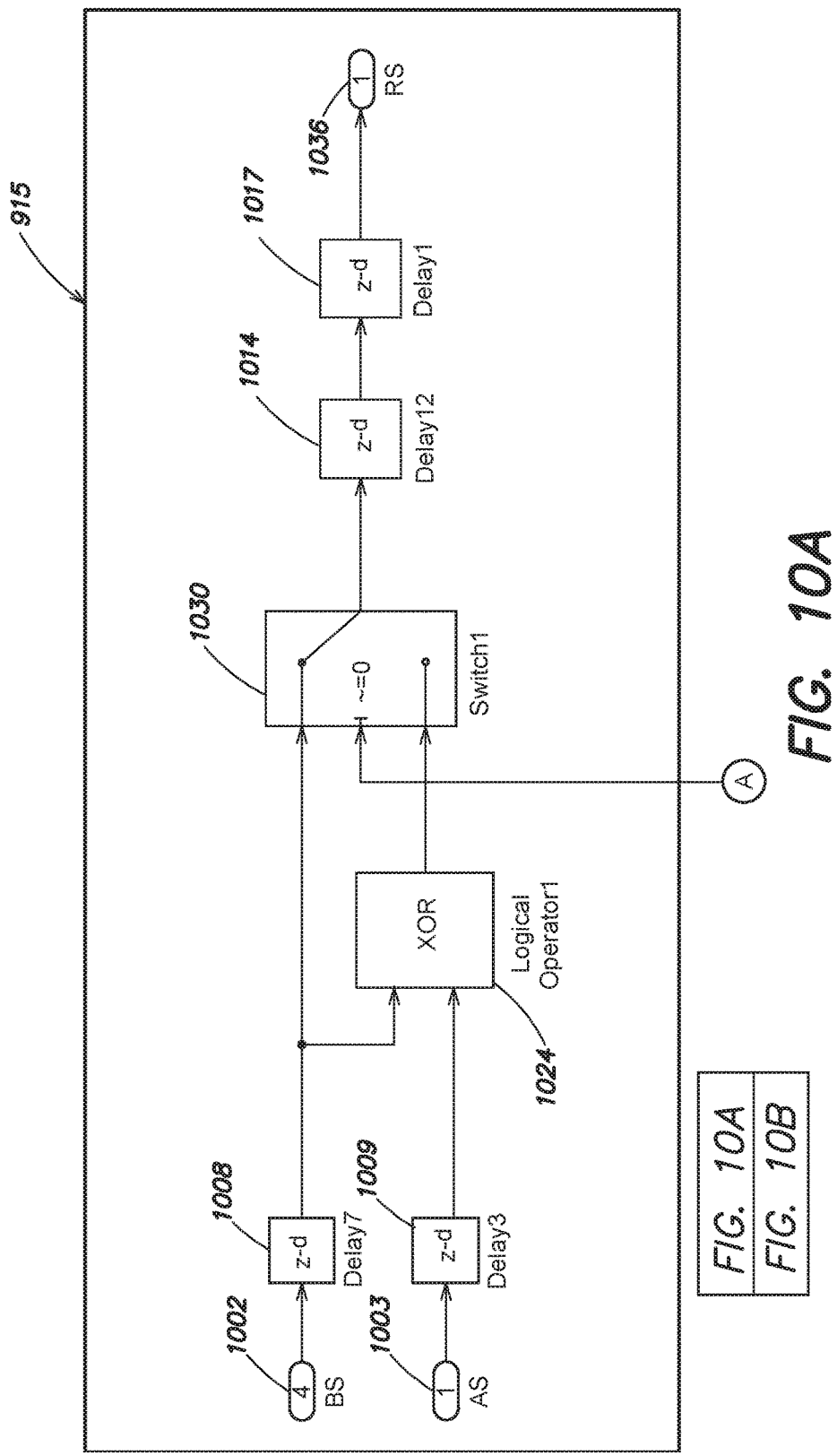
FIGS. 10A and 10B are partial views of a schematic illustration of an example component of the Intermediate Representation (IR) substructure of FIG. 9 in accordance with an embodiment.
Figure 10B:
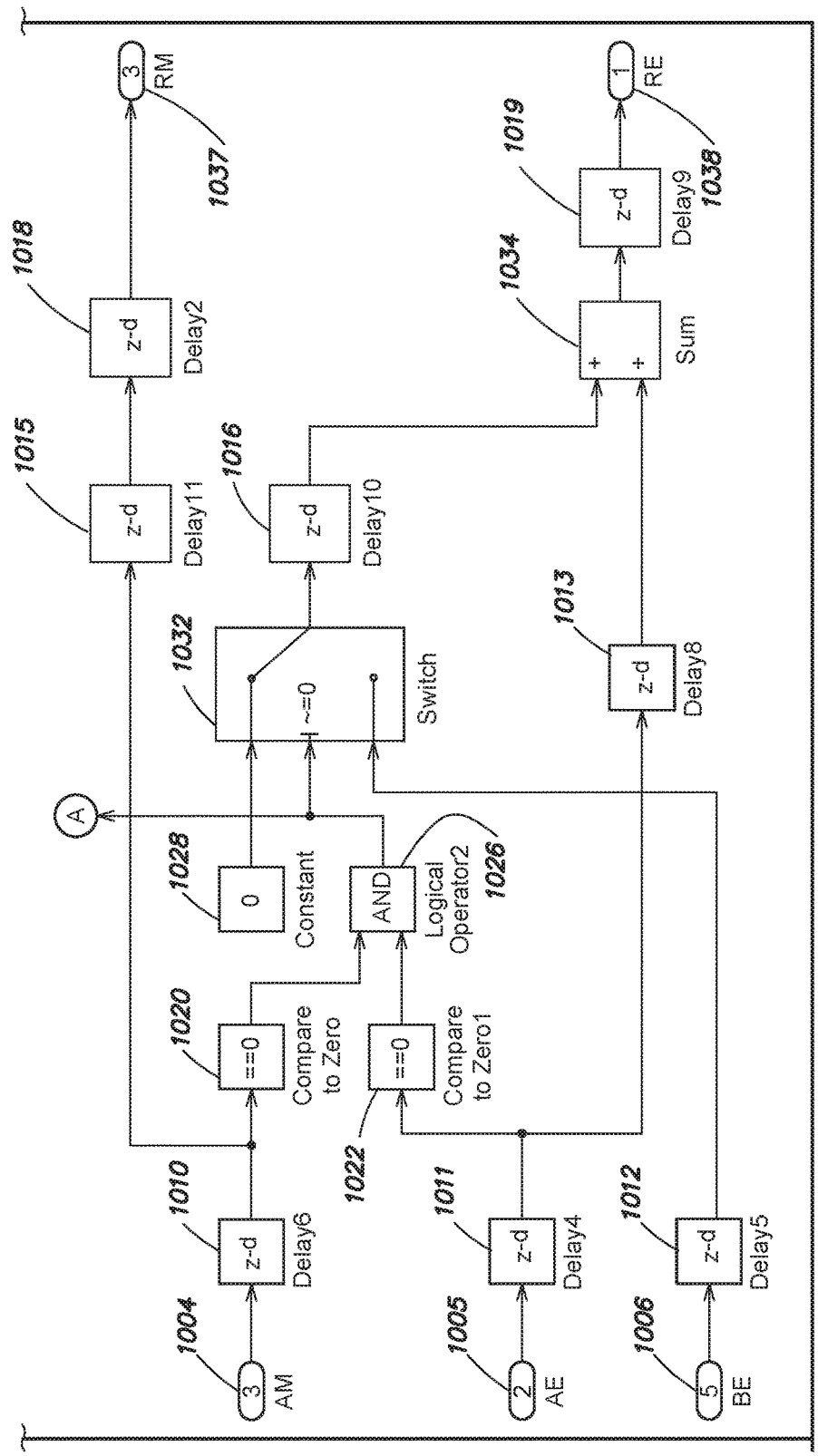

FIG. 10 is a schematic illustration of the Power2 component 915 that has been opened to show its structure. The Power2 component 915 includes five Inport blocks 1002-1006, twelve Delay blocks 1008-1019, two Compare to Zero blocks 1020 and 1022, two logical operator blocks 1024 and 1026 configured to perform XOR and AND logical operations, respectively, a Constant block 1028 configured to output zero, two Switch blocks 1030 and 1032, a Sum block 1034, and three Outport blocks 1036-1038.

The Inport block 1002 receives the zero value from the Constant block 910. The three Inport blocks 1003-1005 receive the sign, mantissa, and exponent values of the input value from the Unpack component 914. The Inport block 1006 receives the −2 value from the Constant block 912. The three Outport blocks 1036-1038 provide the computed sign, mantissa, and exponent values of the output value.

FIGS. 9 and 10 are for illustrative purposes only. It should be understood that other implementations that compute a power 2 function as a function of sign (S), exponent (E), and mantissa (M) values of a floating point value may be utilized.

The insertion engine 516 may insert the IR substructure 900 into an IR created for the model 800 at the portion of the IR that corresponds to the Power 2 Function block 828.

It should be understood that IR substructures 216 for other computational elements, such as Sin, Cos A tan, Add, Divide, Product, Exponent, Log, Reciprocal, Reciprocal Sort, A tan 2, and Square Root, may be constructed and stored in the library of IR substructures 214. In some embodiments, the other IR substructures 216 also include conversion, unpack, functional, and pack components. Furthermore, the unpack component may extract separate sign (S), exponent (E), and mantissa (M) values for a floating point input value. The functional component computes a function, such as a mathematical, a logical, or a trigonometric function utilizing the separate sign (S), exponent (E), and mantissa (M) values for the floating point input value, and producing separate sign (S), exponent (E), and mantissa (M) values for the floating point output value. The Pack component 916 transforms the three separate sign (S), exponent (E), and mantissa (M) values for the floating point output value into a single output value, which may be an integer.

Figure 20:
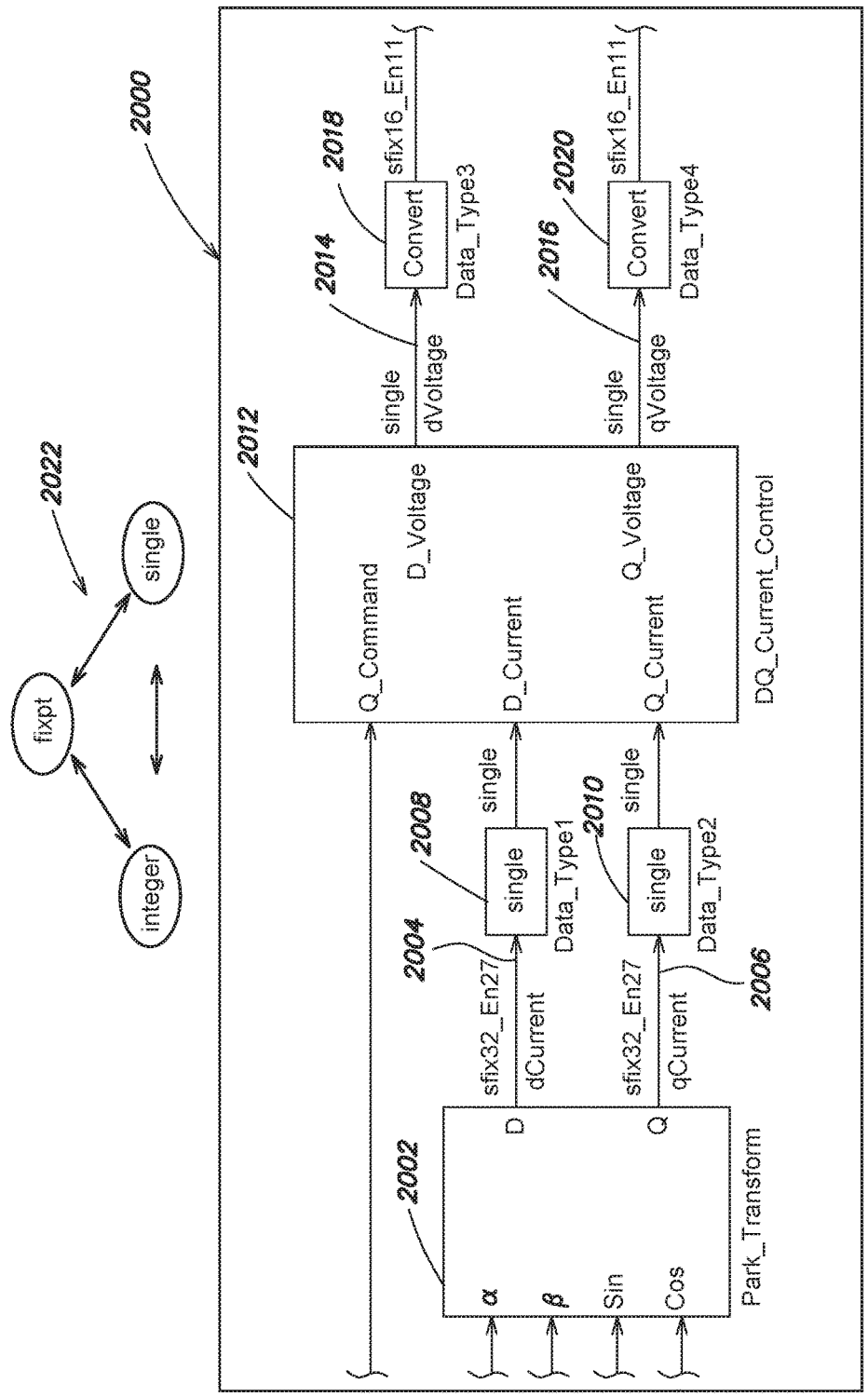
FIG. 20 is a schematic illustration of a portion of an example executable graphical model in accordance with an embodiment.

FIG. 20 is a schematic illustration of a portion of an example executable graphical model 2000 in accordance with an embodiment. The model 2000 may include a component (labeled Part_Transform) 2002 that may compute a direct axis (D) output signal 2004 and a quadratic axis (Q) output signal 2006, for a three-phase sinusoidal input signal. The direct axis (D) output signal 2004 and the quadratic axis (Q) output signal 2006 may have a fixed point data type formats. The model 200 may include conversion elements 2008 and 2010 that convert the direct axis (D) output signal 2004 and the quadratic axis (Q) output signal 2006 from fixed point data type formats to floating point data type formats. The model 2000 also may include a component (labeled DQ_Current_Control) 2012 that implements a desired control functionality. The component 2012 may receive the direct axis (D) and quadratic axis (Q) signals in floating point data type formats, and may compute a direct axis voltage (dVoltage) signal 2014 and a quadratic axis voltage (qVoltage) signal 2016 also in floating point data type formats. The component 2012 may apply floating point arithmetic. The model 2000 may include conversion elements 2018 and 2020 that convert the dVoltage output signal 2014 and the qVoltage output signal 2016 from floating point data type formats to fixed point data type formats, e.g., for processing by other portions of the model 2000.

Code may be generated for the model 2000. During the code generation process, one or more IRs may be generated for the model 2000. The portion of the one or more IRs corresponding to the DQ_Current_Control component 2012 may be lowered or reduced to base operations, such as Add, Subtract, Multiply, Cos, Sin, etc. The floating point transmutation engine 508 may replace those portions of the IR corresponding to the Add, Subtract, Multiply, Cos, Sin, etc. operations with IR substructures 216 that utilize sign (S), exponent (E), and mantissa (M) values in integer, fixed point, or Boolean data type formats. The generated code may thus include variables or values with integer, fixed point, or Boolean data type formats, and no variables or values with floating point data type formats. Thus, even though the DQ_Current_Control component 2012 is designed to operate on values with floating point data type formats, the generated code may be deployed on a target device having no Floating Point Unit (FPU).

As illustrated by the graphic 2022, the systems and methods of the present disclosure can generate code for a model having multiple different data type formats, e.g., floating point and fixed point, where the code includes values or variables with only integer, fixed point, or Boolean data type formats. That is, the code may be free of variables and values having floating point data type formats.

Figure 11:
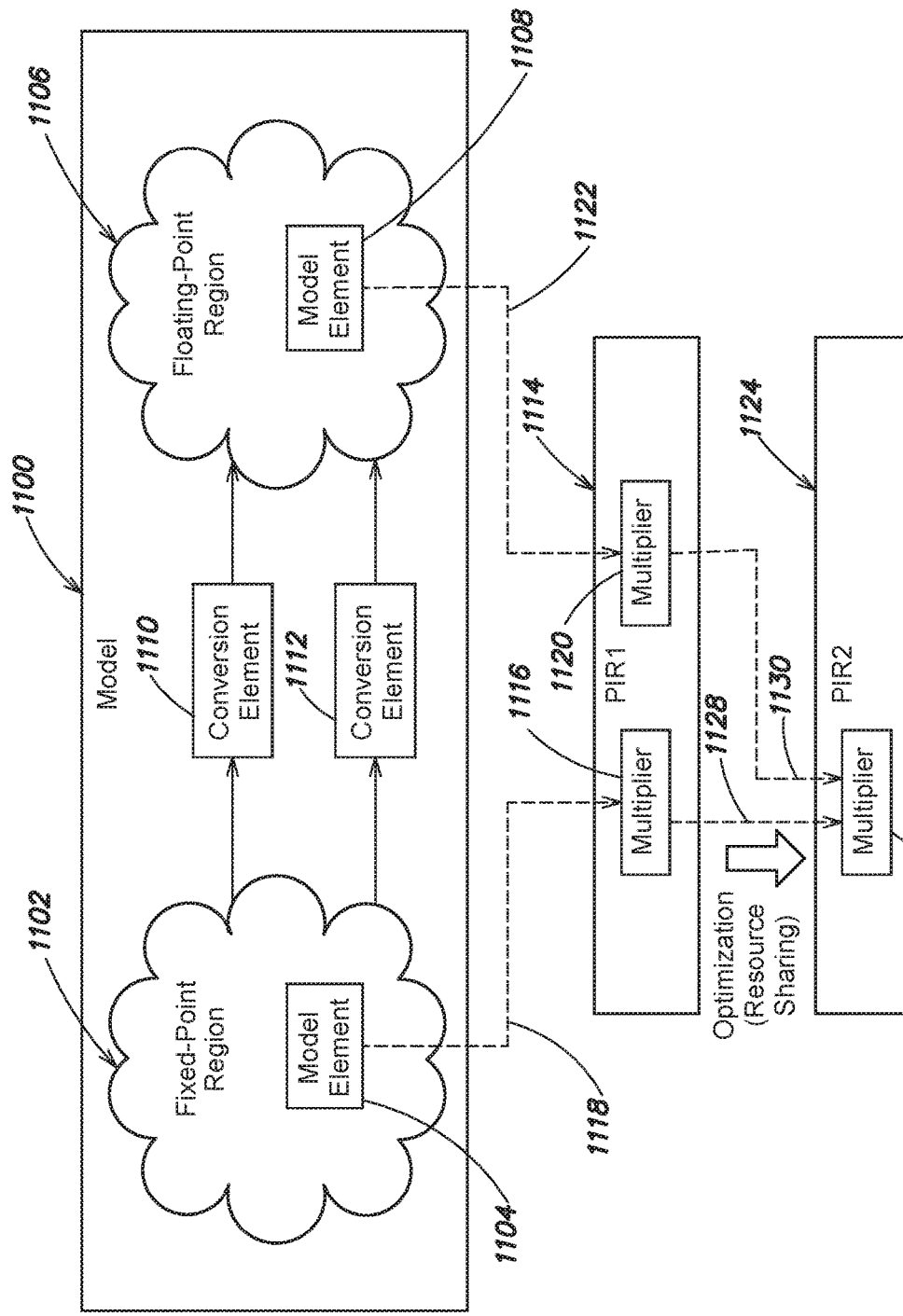
FIG. 11 is an illustration of an example executable graphical model in accordance with an embodiment.

FIG. 11 is a schematic illustration of an executable graphical model 1100 in accordance with an embodiment. The model 1100 may include a fixed-point region 1102 that includes model elements, such as model element 1104, that operate on fixed-point data types. The model 1100 also may include a floating point region 1106 that includes model elements, such as model element 1108, that operate on floating point data types. The floating point region 1106 may include operations that may be difficult to implement in fixed point data types. For example, signals or other data in the floating point region 1106 may have large and/or unknown dynamic ranges. The floating point region 1106 may include operators for which fixed-point equivalents are not available or are difficult to create, such as a tan 2 operators.

The two regions 1102 and 1106 may be interconnected and may share data. For example, the two regions 1102 and 1106 may be connected by conversion elements 1110 and 1112 that convert fixed-point data generated by the fixed-point region 1102 to floating point data for use in the floating point region 1106. In some implementations, the code generator 206 may generate code for the model 1100 suitable for use with programmable logic devices or microcontrollers that lack FPUs without having to convert the floating point region 1106 to fixed-point data types.

During the code generation process, the code generator 206 may generate a first PIR 1114 for the model 1100. Suppose the model element 1104 of the fixed-point region 1102, when lowered, includes a multiplier operation. The PIR 1114 may include a multiplier 1116 that corresponds to the model element 1104, as indicated by dashed arrow 1118. Suppose also the model element 1108 of the floating point region 1106, when lowered, includes a multiplier operation. The PIR 1114 may include a multiplier 1120 that corresponds to the model element 1108, as indicated by dashed arrow 1122.

The optimization engine 506 may apply one or more optimization operations across the entire first PIR 1114, which represents both the fixed-point region 1102 and the floating point region 1106 of the model 1100. That is, the IR substructures 216 are in a form accessible to the optimization engine 506. The optimization engine 506, for example, may determine that the two multipliers 1116 and 1120 may be replaced with a single shared multiplier. Accordingly, the optimization engine 506 may produce a second IR 1124 having a single multiplier 1126 in place of the two multipliers 1116 and 1120, as indicated by dashed arrows 1128 and 1130.

It should be understood that FIG. 11 is intended for illustrative purposes only, and that other IR-wide optimizations or procedures may be applied. For example, the optimization engine 506 may determine that one of the inputs to a multiplier from an IR substructure 216 is always a given value, e.g., six. The optimization engine 506 may replace the multiplier with a gain whose gain parameter is six. In other embodiments, the optimization engine 506 may introduce pipelining across the entire IR 212, such as Input/Output (IO) pipeline, distributed pipelining, constrained pipelining, or clock rate pipelining. In other embodiments, the optimization engine 506 may apply streaming optimizations. Those skilled in the art will understand that other optimizations may be applied.

In some embodiments, the optimization engine 506 may determine that one or more of the sign (S), exponent (E), and/or mantissa (M) input values or output values of for a particular IR substructure of the IR is a constant value. In such cases, the optimization engine 506 may not represent the constant sign (S), exponent (E), and/or mantissa (M) as a variable. Instead, the optimization engine 506 may replace the constant sign (S), exponent (E), and/or mantissa (M) with the constant value. In some embodiments, the optimization engine 506 may identify a multiplication by a constant power of two. For such an operation, the optimization engine 506 may add a bias to the exponent (E) part of the SEM component, thus avoiding a single precision multiplier.

One or more optimizations may be applied to a primitive itself, for example, a power of 2 multiplier may be replaced by exponent only scaling, thus avoiding use of an IR substructure for a multiplier. Another optimization includes sharing of argument reduction blocks in Sin/Cos IR substructures.

Additional optimizations that may be applied include:

1. For Modulus/Division/Remainder by a constant, an optimization may utilize a faster look-up table instead of long-latency slower iterative implementation.

2. For Multiply by −1, which is simply toggling the sign bit, an optimization may not use a cost-intensive floating point multiplier implementation.

3. For Multiply by a constant, canonical signed digit (CSD) and factorization canonical signed digit (FCSD) optimizations may be used, instead of using full cost-intensive floating point multiplier. This optimization may replace multiplication with canonical sign digit add and shift algorithms, thereby avoiding multipliers. This optimization may be used with FPGAs where multiplication primitives are scarce or unavailable.

4. For Boolean to Single Data Type Conversion, which is simply just changing the exponent bits, an optimization may not use cost-intensive data type conversion operation. A similar optimization may be relevant for Single to Boolean conversions as well.

5. Optimization decisions may be based on user design objective. For example, for polynomial approximation, methods may use for floating point elementary operations, such as Sin/Cos, Exp/Log. There may be two implementations available for these floating point elementary operations: area-intensive but low latency high-order table-based method (HOTBM) and low-area but high latency Homer evaluation scheme, such as Remez, or Taylor. Either or both implementations may be selected based on user input concerning design objectives, such as low area versus low latency.

6. For devices that have lower input DSPs, a high-bit multiplication in an implementation may be replaced by a fast multiplication algorithm, such as Karatsuba, or Karatsuba-Ofman, to optimize the number of DSPs.

7. Some optimization may trade accuracy for a savings in area. For example, a user may want to save excessive area by compromising on last-bit accuracy for some operators. More specifically, the normalization rounding operation, or in some cases, such as reciprocal implementation, removing an entire Newton-Raphson iteration may be optimized away, if the user is satisfied with the functional accuracy achieved by the code generator.

8. The outcome of a floating-point operation may be brought to its normalized form. Normalization is the process by which the mantissa bits are shifted right or left, such that the most significant bit is "1". Normalization may be accomplished using a leading zero counter (LZC) and a normalization shifter. For example, the LZC counts the number of leading zeros of a floating point result, and the floating point result may be shifted to the left based on the number of zeros that were counted. When datapath contains floating point operations in successive stages, the normalization and LZC (leading zero counter) blocks in intermediate stages may be optimized away to improve area and latency. In such cases, normalization/LZC may only be required at the final stages. In some situations, the mantissa width for intermediate stages may be increased to accommodate more guard bits for guaranteeing rounding accuracy. This may be done specifically for Complex Multipliers, Adder Trees, and Dot Products, among others.

Figure 21:
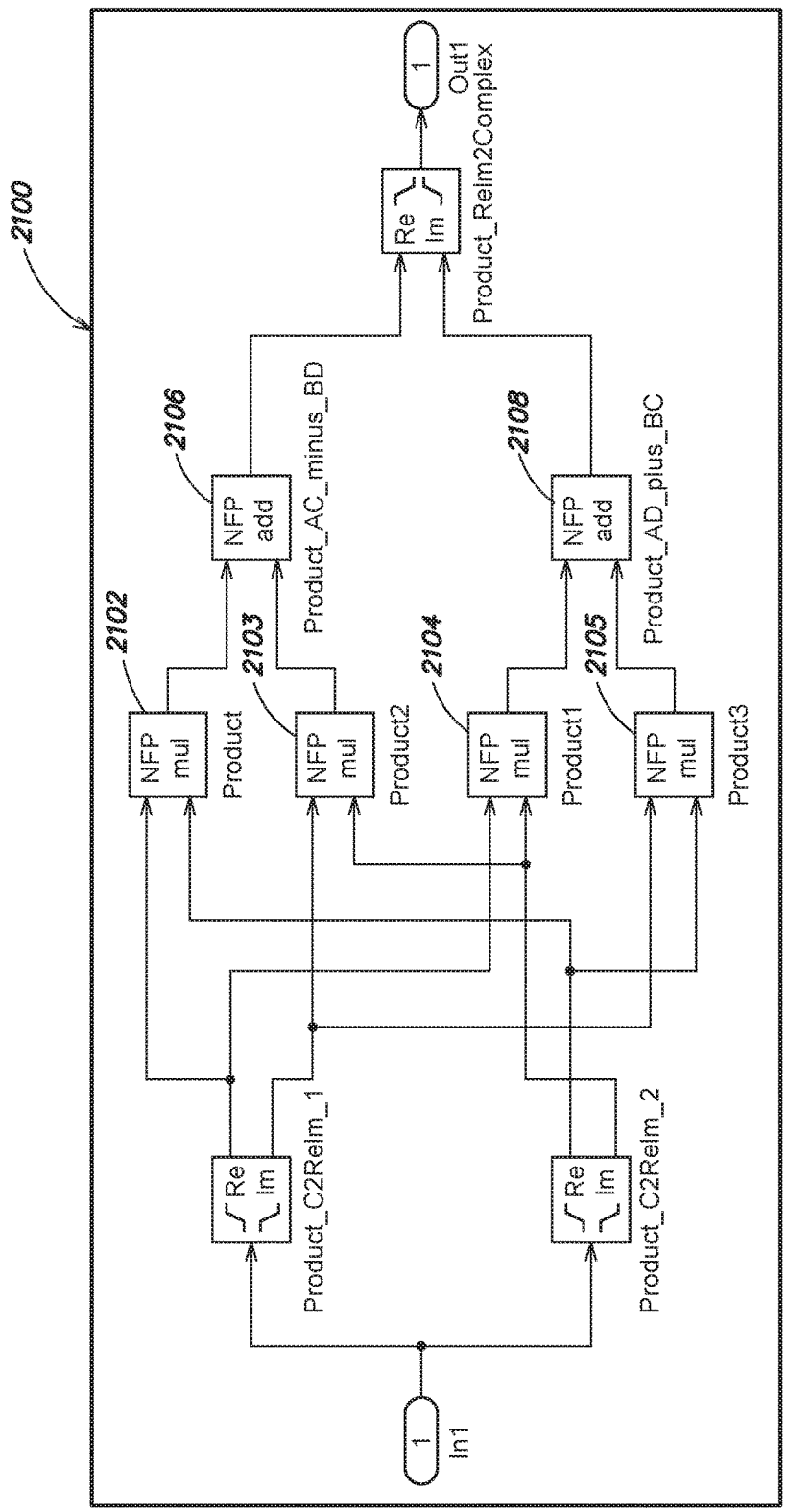
FIG. 21 is a schematic illustration of an example of an elaborated complex multiplier in accordance with an embodiment.

FIG. 21 is a schematic illustration of an example of an elaborated complex multiplier 2100 in accordance with an embodiment. The multiplier 2100 includes four IR substructures for product operations 2102-2105, and two IR substructures for add operations 2106 and 2108.

Those skilled in the art will understand that other optimizations may be utilized.

In some embodiments, one or more IR substructures may be implemented as a program emulation. The program emulation may be created in a programming language, such as C, C++, Java, MATLAB, etc. The program emulation may be serialized to memory. That is the program emulation may be converted to a stream of data and serialized to disk or to a socket connection for transmission to another data processing device, e.g., for remote storage.

When the floating point transmutation engine 508 determines that a portion of an IR should be replaced with an S-E-M based implementation, the floating point transmutation engine 508 may read back the program emulation from its serialized state into the IR.

In some embodiments, one or more IR substructures 216 and/or program emulations may be parameterized. For example, the values specifying the length of the exponent (E) and the length of the mantissa (M) may be represented by parameters. For a given IR substructure 216, the values assigned to these parameters may be modified. For example, suppose a user wants to utilize an IEEE 754 extended floating point format, such as single extended or double extended, or create a non-standard floating point data type, such as a 19-bit, 35-bit, or a 74-bit floating point data type, among others. To create such a non-standard floating point data type, the user may assign desired values to the exponent and mantissa parameters of the emulation.

In some embodiments, the IR substructures or emulations may first reinterpret and decompose the numeric input value having the floating point data type into three numeric input values having Boolean, integer, or fixed-point data types. The three numeric input values may correspond to the sign (S), the exponent (E), and the mantissa (M) of the floating point data type. The IR substructures or emulations may next perform an algorithmic operation on the three Boolean, integer, or fixed-point numeric input values. The algorithmic operation performed by the plurality IR components on the three Boolean, integer, or fixed-point numeric input values may be equivalent to the function performed by the computational element on the floating point numeric input value. The IR substructures or emulations may assemble the sign (S), the exponent (E), and the mantissa (M) output values as an integer or fixed-point data type, and then reinterpret the integer or fixed-point data type as a floating point data type.

The IEEE 754 standard includes support for normals, denormals, positive and negative infinity, positive and negative zero, and Not a Number (NaN). For a normal floating point value, the non-fractional "1" before the mantissa is not stored as part of the value. Instead, it is implied. The mantissa or significand only includes the fractional portion.

A normal is represented as:

$$(-1)^{sign\ bit} * 2^{exponent-bias} * (1+\text{fractional mantissa})$$

A denormal number is a number in floating point format that does not have a normalized mantissa, e.g., there is no implicit "1" before the mantissa. Instead, a denormal, sometimes called a subnormal, is understood to be 0.xxx . . . times 2 raised to some power. This provides an extended range of very small numbers. However, it comes at the expense of gradually losing precision as the first "1" bit moves farther to the right (leaving less room for significant figures). Positive zero and negative zero are denormals.

A denormal is represented as:

$$(-1)^{sign\ bit} * 2^{-bias+1} * (\text{fractional mantissa})$$

For single precision floating point, positive infinity is represented as sign (S)=0, exponent (E)=255, and mantissa (M)=0.

Negative infinity is represented as sign (S)=1, exponent (E)=255, and mantissa (M)=0.

Positive zero is represented as sign (S)=0, exponent (E)=0, and mantissa (M)=0.

Negative zero is represented as sign (S)=1, exponent (E)=0, and mantissa (M)=0.

Positive and negative infinity are represented with a biased exponent of all '1' bits, and a mantissa of all '0' bits. The value of the sign bit indicates positive or negative infinity.

A Not a Number (NaN) is represented as sign (S)=0 or 1, exponent (E)=255, and at least one bit in the mantissa (M) is nonzero. Floating point exceptions, such as division by zero and square root of a negative number, are typically represented by NaN.

In some embodiments, the IR substructures 216 and/or the emulations are constructed to support IEEE 754 normals, denormals, positive infinity, negative infinity, positive zero, negative zero, and NaNs. For example, the IR substructures and/or the emulations may include one or more portions dedicated to detecting and/or handling denormals, e.g., as provided in the IEEE 754 standard.

In some embodiments, the code generator 206 may analyze a model to determine the absence of one or more numerical conditions, such as denormals or subnormals, negative or positive infinities, negative or positive zeros, or NaNs. For example, the code generator 206 may perform range analysis to determine whether any values will be denormals, negative or positive infinity, zero, or NaNs, e.g., during execution of the source model. If the code generator 206 determines that a given value will not be a denormal, then the code generator may remove the one or more portions of the IR substructures and/or emulations dedicated to detecting and/or handling denormals. Code generation may then proceed with the revised IR substructures and/or emulations, resulting in more efficient code, e.g., code requiring less area, executing faster, or consuming less power. In other words, the code generator 206 may generate code that complies with the IEEE 754 standard without accounting for the one or more numerical conditions that have been determined to be absent from the model.

In some embodiments, a user settable option may be provided whether to conduct range analysis, and remove the one or more portions of the IR substructures and/or emulations for detecting and/or handling denormals, negative or positive infinity, zero, or NaNs.

The code generator 206 also may detect overflow or underflow conditions that occur in floating point calculations within the model, and that are not in compliance with the IEEE 754 standard. The overflow or underflow conditions may comprise negative or positive overflows or underflows, or zero, and the detecting may be based on analyzing the sign (S), exponent (E), and mantissa (M) of input or output values.

Floating point computations may have inherent rounding errors. Rounding errors may be measured by determining the Unit in Last Place (ULP) and/or the relative error. ULP refers to gap between two floating point numbers nearest a value, x, even if one of the floating point numbers is x. The gap varies with the magnitude of x. The relative error is the difference between the two floating point numbers nearest x divided by x.

In some embodiments, the code generator 206 may check the generated code for floating point tolerance using ULP or relative error.

FIG. 12 is an example of code 1200 of a function for performing a ULP error check in accordance with an embodiment. The code 1200 is written in the MATLAB programming language. The code 1200 defines a function called 'ulpErrCheck' whose inputs are P, R, and ToleranceValue, and whose output is y. P and R are the two values being compared, and ToleranceValue is the specified ULP tolerance. The code 1200 constructs fixed-point data type objects for P and R that are signed, 32-bit, zero fraction length. The code 1200 computes the absolute value of the difference between the fixed-point data type objects for P and R. The function outputs true if the computed absolute value is less than or equal to the specified ToleranceValue, and false if the computed absolute value is greater than the specified ToleranceValue.

FIG. 13 is another example of code 1300 of a function for performing a ULP error check in accordance with an embodiment. The code 1300 is written in the MATLAB programming language. The code 1300 defines a function called 'ulpErrorCheck' whose inputs are P, R, and tolerance, and whose output is 'err'. P and R are the two values being compared, and ToleranceValue is the specified ULP tolerance. The code 1300 constructs fixed-point data type objects for P and R that are signed, 32-bit, zero fraction length. The code 1300 applies a sign function to the fixed-point data type objects for P and R, which returns '1' if P or R is positive, zero if P or R is zero, and −1 if P or R is negative, and determines whether the output of the sign function is the same for both P and R. If the output of the sign functions for both P and R are the same, the code 1300 outputs True if the absolute value of the difference between the fixed-point data type objects for P and R is less than or equal to tolerance, and otherwise outputs False. If the output of the sign functions for both P and R are different, the code 1300 outputs True if the sum of the absolute value P and the absolute value of R are less than or equal to tolerance, and otherwise outputs False.

FIG. 14 is an example of code 1400 of a function for performing a relative error check. The code 1400 defines a function called 'relativeErrorCheck' whose inputs are P, Q, and tolerance, and whose output is 'err'. P and Q are the two values being compared, and 'err' is the relative error value. The code 1400 computes the absolute value of the difference between P and Q. If the absolute value of the difference between P and Q is less than tolerance, the function outputs 1. Otherwise, the code 1400 determines whether the values of P and Q are equivalent. If so, the function outputs 1. Otherwise, the code 1400 determines whether P or Q or both are zero. If so, the function outputs True if the absolute value of the difference between and P and Q is less than tolerance. Otherwise, the function outputs True if the absolute value of the difference between and P and Q divided by the maximum of the absolute value of P and the absolute value of Q is less than tolerance.

Error check functions may provide a convenient way for users to perform cosimulation and hardware-in-loop (HIL), e.g., using FPGA hardware, verification. For example, the error check functions may assist users to reconcile outputs or other answers between a source program or model, such as a MATLAB program and/or a Simulink model, running on a desktop computer, and generated code running on hardware, such as an FPGA. The error check functions may explain to the user why certain operations result in small differences because of Unit in Last Place (ULP) errors, causing errors in the magnitude range of $2^{-23}$, which may be a small difference for single-precision numbers.

Figure 15:
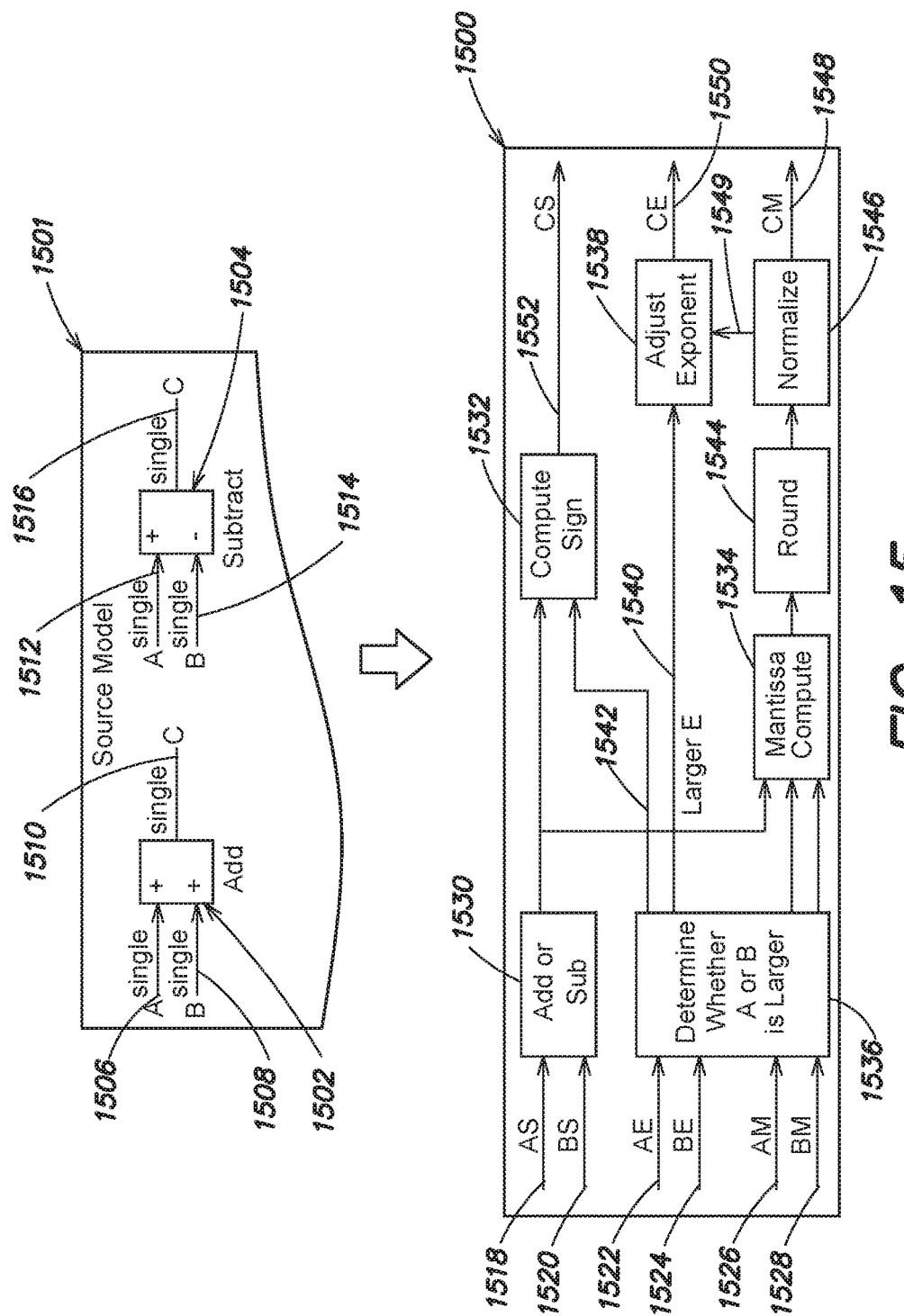
FIG. 15 is a schematic illustration of an example algorithmic element of an IR substructure in accordance with an embodiment.

FIG. 15 is a schematic illustration of an example algorithmic element 1500 of an IR substructure for an Add computational element or a Subtract computational element of a model in accordance with an embodiment. For example, an executable source model 1501 may include computational elements implemented as an Add block 1502 and/or a Subtract block 1504. The Add block 1502 may read the values A and B of two input signals 1506 and 1508, and may write the value C of an output signal 1510 that is the sum of the input values A and B. The data types of the input signals 1506 and 1508, and of the output signal 1510 may be single precision floating point. The Subtract block 1504 may read the values A and B of two input signals 1512 and 1514, and may write the value C of an output signal 1516 that is the difference of the input values A and B.

The algorithmic component 1500 may perform the operation, e.g., add or subtract, using separate sign (S), exponent (E), and mantissa (M) input values, and may produce separate sign (S), exponent (E), and mantissa (M) output values. For example, the algorithmic component 1500 may apply integer arithmetic, and be designed to comply with the IEEE 754 standard. The IR substructure for the Add or Subtract computational elements 1502 and 1504 may reinterpret the data types of the input values A and B, e.g., from single precision floating point to integer, such as 32-bit integer (int32), and may unpack the sign (S), exponent (E), and mantissa (M) values, producing two sign input values 1518 and 1520 (AS and BS), two exponent input values 1522 and 1524 (AE and BE), and two mantissa input values 1526 and 1528 (AM and BM).

The algorithmic component 1500 may include an Add or Subtract element 1530 that adds or subtracts the two sign (S) input values 1518 and 1520 (AS and BS), and provides the result to a Compute Sign element 1532 and to a Mantissa Compute element 1534. The algorithmic component 1500 also may include a comparison element (labeled Determine whether A or B is larger) 1536 that receives the two exponent (E) input values 1522 and 1524 (AE and BE) and the two mantissa (M) input values 1526 and 1528 (AM and BM), and determines which input value, A or B, is larger. The comparison element 1536 provides the exponent (E) value of the larger input value to an Adjust Exponent element 1538, as indicated by arrow 1540, and the exponent (E) value of the smaller input value to the Compute Sign element 1532, as indicated by arrow 1542. The comparison element 1536 provides the two mantissa (M) values (AM and BM) to the Mantissa compute element 1534, which provides its output to a Round element 1544 that performs one or more rounding operations on the output of the Mantissa Compute element 1534. A normalize element 1546 normalizes the output from the Round element 1544 producing a mantissa (M) output value 1548. The normalized mantissa value is also provided to the Adjust Exponent element 1538, as indicated by arrow 1549, to compute an exponent (E) output value 1550. The Compute Sign element 1532 computes a sign (S) output value 1552.

The IR substructure for the Add or Subtract computational element 1502 or 1504 may further include one or more pack components that assemble the sign (S) output value 1552, the exponent (E) output value 1550, and the mantissa (M) output value 1548 computed by the algorithmic component 1500 into a single output value. The IR substructure also may include one or more elements that reinterpret the data type of the assembled output value C, e.g., from a 32-bit integer (int32) to a single precision floating point.

Figure 16:
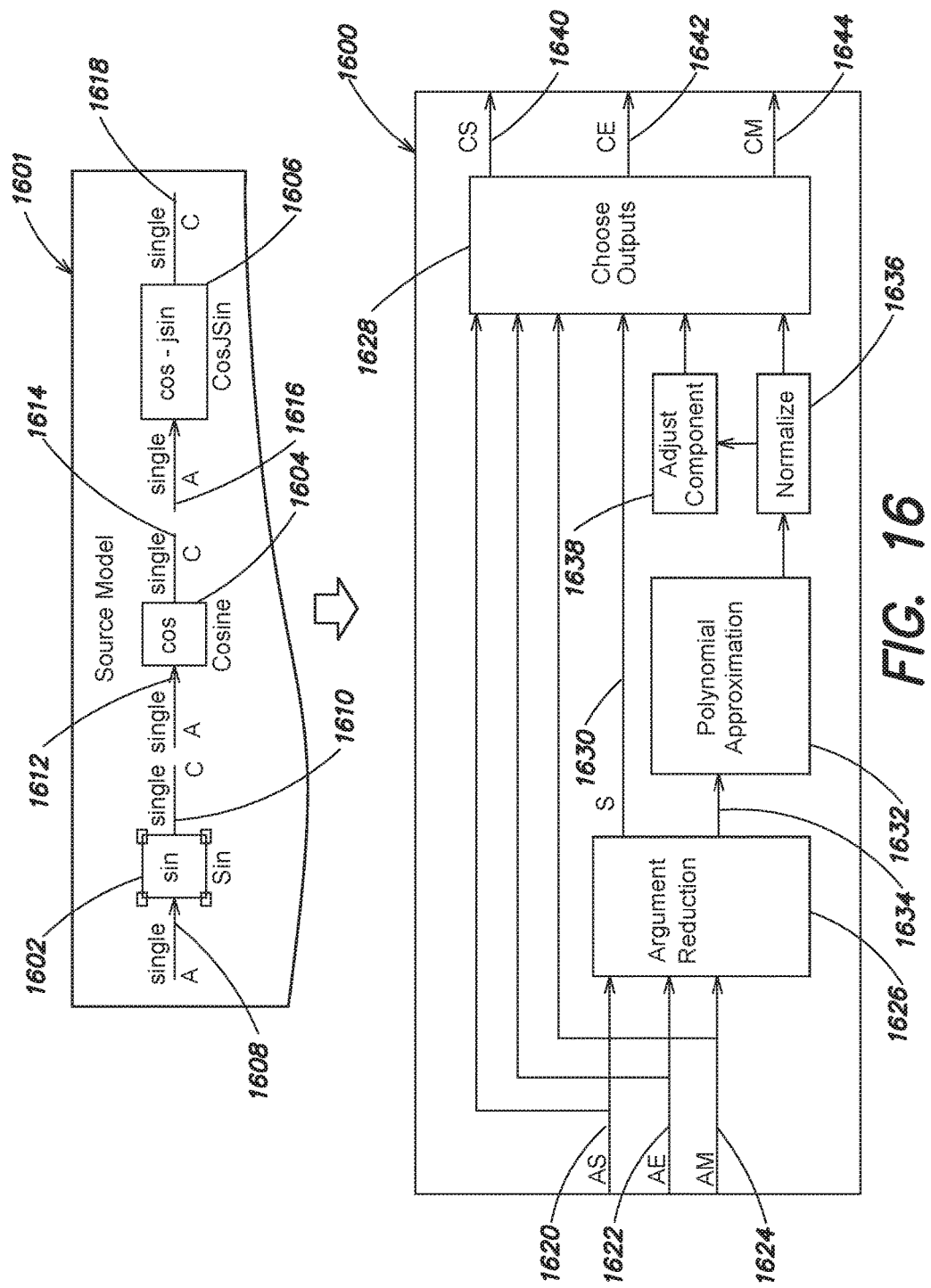
FIG. 16 is a schematic illustration of another example algorithmic element for an IR substructure in accordance with an embodiment.

FIG. 16 is a schematic illustration of an example algorithmic element 1600 of an IR substructure of a trigonometric computational element, such as Sin, Cos, and Euler's formula (cos+j sin) in accordance with an embodiment. For example, an executable source model 1601 may include one or more computational elements implemented as a Sin block 1602, a Cos block 1604, and/or an Euler's formula block 1606. The Sin block 1602 may read the value A of an input signal 1608, and write the value C of an output signal 1610 that is the sine of the input value A. The data types of the input signal 1608 and the output signal 1610 may be single precision floating point. The Cos block 1604 may read the value A of an input signal 1612, and may write the value C of an output signal 1614 that is the cosine of the input value A. The data types of the input signal 1612 and the output signal 1614 may be single precision floating point. The Euler's formula block 1606 may read the value A of an input signal 1616, and may write the value C of an output signal 1618 that is the cosine+sine of the input value A. The data types of the input signal 1616 and the output signal 1618 may be single precision floating point.

The algorithmic component 1600 may perform the respective trigonometric operation using separate sign (S), exponent (E), and mantissa (M) input values, and may produce separate sign (S), exponent (E), and mantissa (M) output values. The algorithmic component 1600 may apply integer arithmetic, and be designed to comply with the IEEE 754 standard. The IR substructure for the trigonometric computational elements 1602, 1604, and 1606 may reinterpret the data type of the input value A, e.g., from single precision floating point to integer, such as 32-bit integer (int32), and may unpack the sign (S), exponent (E), and mantissa (M) values, producing a sign input value 1620 (AS), an exponent input value 1622 (AE), and a mantissa input value 1626 (AM).

The algorithmic component 1600 may include an Argument Reduction element 1626 that provides a first output for the sign (S) value to a Choose Outputs element 1628, as indicated by arrow 1630, and a second output to a Polynomial Approximation element 1632, as indicated by arrow 1634. The Argument Reduction element 1626 and the Polynomial Approximation element 1632 may be suited for HDL code generation. For example, the Argument Reduction element 1626 may use a table of 2/pi shifted by exponent values that can be mapped to one or more Read Only Memory (ROM) units or Configurable Logic Blocks (CLBs) of a programmable logic device. The Polynomial Approximation element 1632 may use a Remez algorithm to approximate sin(x*pi/2)x where 0<=x<1. The Polynomial Approximation element 1632 may reduce the polynomial order by splitting values from 0 to 1 to 128 sub-domains, and using lower order polynomials for each sub-domain. The lower order polynomials may be used to obtain sin(x)/x, which may be multiplied by x to get sin(x).

A normalize element 1636 may normalize a mantissa value output by the Polynomial Approximation element 1632. The normalized mantissa value may be provided to the Choose Outputs element 1628, and to an Adjust Exponent element 1638. The Choose Outputs element 1628 may compute a sign (S) output value 1640, an exponent (E) output value 1642, and a mantissa (M) output value 1644.

The IR substructure for the trigonometric computational element may further include one or more pack components that assemble sign (S) output value 1640, the exponent (E) output value 1642, and the mantissa (M) output value 1644 computed by the algorithmic component 1600 into a single output value. The IR substructure also may include one or elements that reinterpret the data type of the assembled output value C from integer to single precision floating point.

Figure 17:
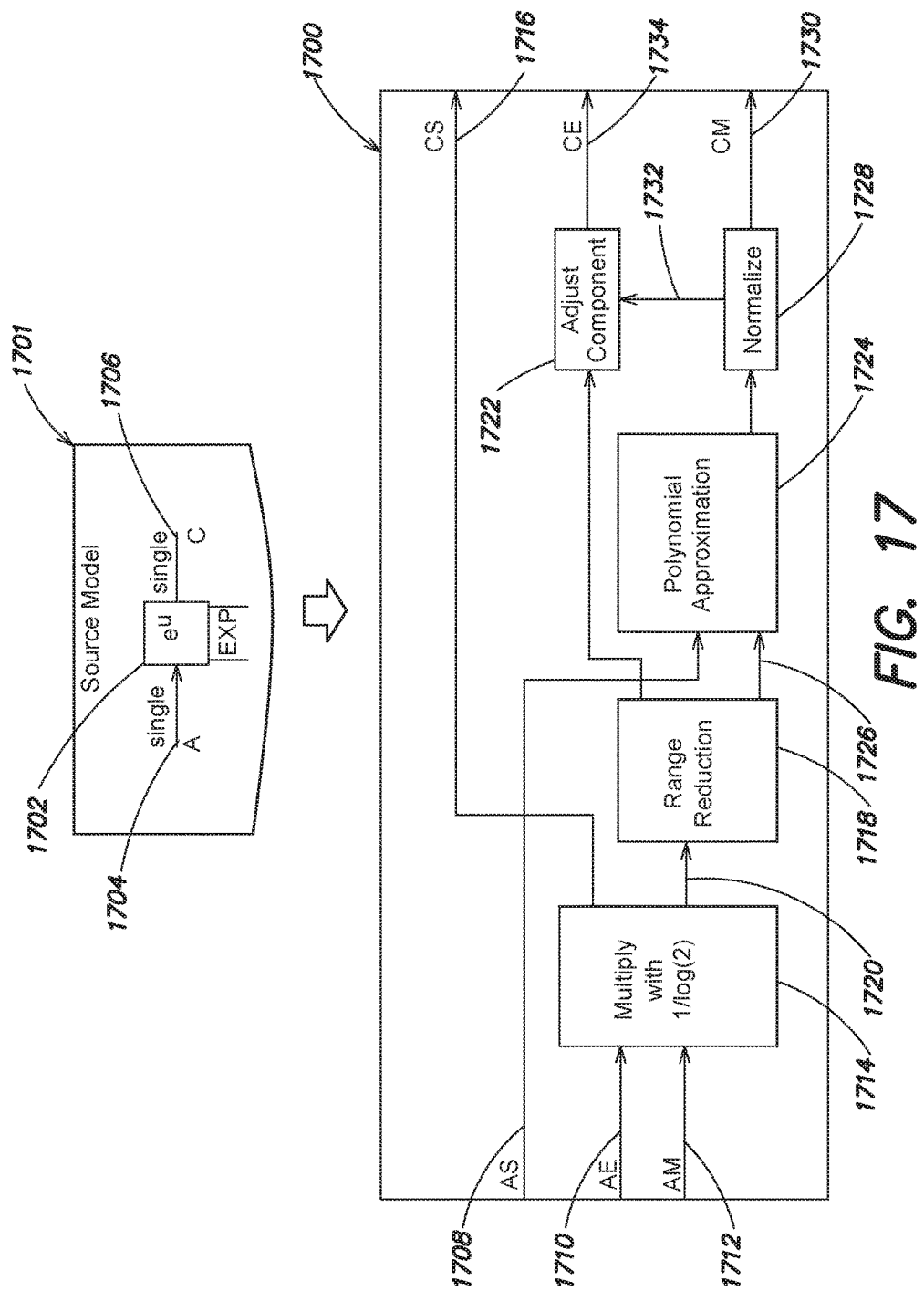
FIG. 17 is a schematic illustration of yet another example algorithmic element for an IR substructure in accordance with an embodiment.

FIG. 17 is a schematic illustration of an example algorithmic element 1700 of an IR substructure for an Exponent computational element of a model in accordance with an embodiment. For example, an executable source model 1701 may include a computational element implemented as an Exponent block 1702. The Exponent block 1702 may read the value A of an input signal 1704, and may write the value C of an output signal 1706 that is the exponent of the input value A. The data types of the input signal 1704 and of the output signal 1706 may be single precision floating point.

The algorithmic component 1700 may perform the exponent operation using separate sign (S), exponent (E), and mantissa (M) input values, and may produce separate sign (S), exponent (E), and mantissa (M) output values. For example, the algorithmic component 1700 may apply integer arithmetic, and be designed to comply with the IEEE 754 standard. The IR substructure 1700 for the Exponent computational element 1702 may reinterpret the data type of the input value A, e.g., from single precision floating point to integer, such as 32-bit integer (int32), and may unpack the sign (S), exponent (E), and mantissa (M) values, producing a sign (S) input value 1708 (AS), an exponent (E) input value 1710 (AE), and a mantissa (M) input value 1712 (AM).

The algorithmic component 1700 may include a Multiply with 1/log(2) element 1714 that multiplies the exponent and mantissa input values 1710 and 1712 by 1/log(2). An output of the Multiply with 1/log(2) element 1714 is a computed sign (S) output value 1716. Another output of the Multiply with 1/log(2) element 1714 is provided to a Range Reduction element 1718, as indicated by arrow 1720. An output of the Range Reduction element 1718 is provided to an Adjust Exponent element 1722. Another output of the Range Reduction element 1718 is provided to a Polynomial Approximation element 1724, as indicated by arrow 1726. Another input of the Polynomial Approximation element 1724 is the sign (S) input value 1708. The normalized mantissa value is also provided to the Adjust Exponent element 1722, as indicated by arrow 1732, which computes an exponent (E) output value 1734.

The IR substructure for the Exponent computational element 1702 may further include one or more pack components that assemble sign (S) output value 1716, the exponent (E) output value 1734, and the mantissa (M) output value 1730 computed by the algorithmic component 1700 into a single output value. The IR substructure also may include one or elements that reinterpret the data type of the assembled output value C, e.g., from a 32-bit integer (int32) to a single precision floating point.

As described, the algorithmic components 1500, 1600, and 1700 may be designed for efficient hardware implementation, e.g., on a Field Programmable Gate Array (FPGA) or other programmable logic device. For example, full add shift logic and/or partial add shift logic may be used in place of multipliers.

FIGS. 15, 16, and 17 are intended for illustrative purposes. It should be understood that other algorithmic component designs may be utilized.

Figure 24:
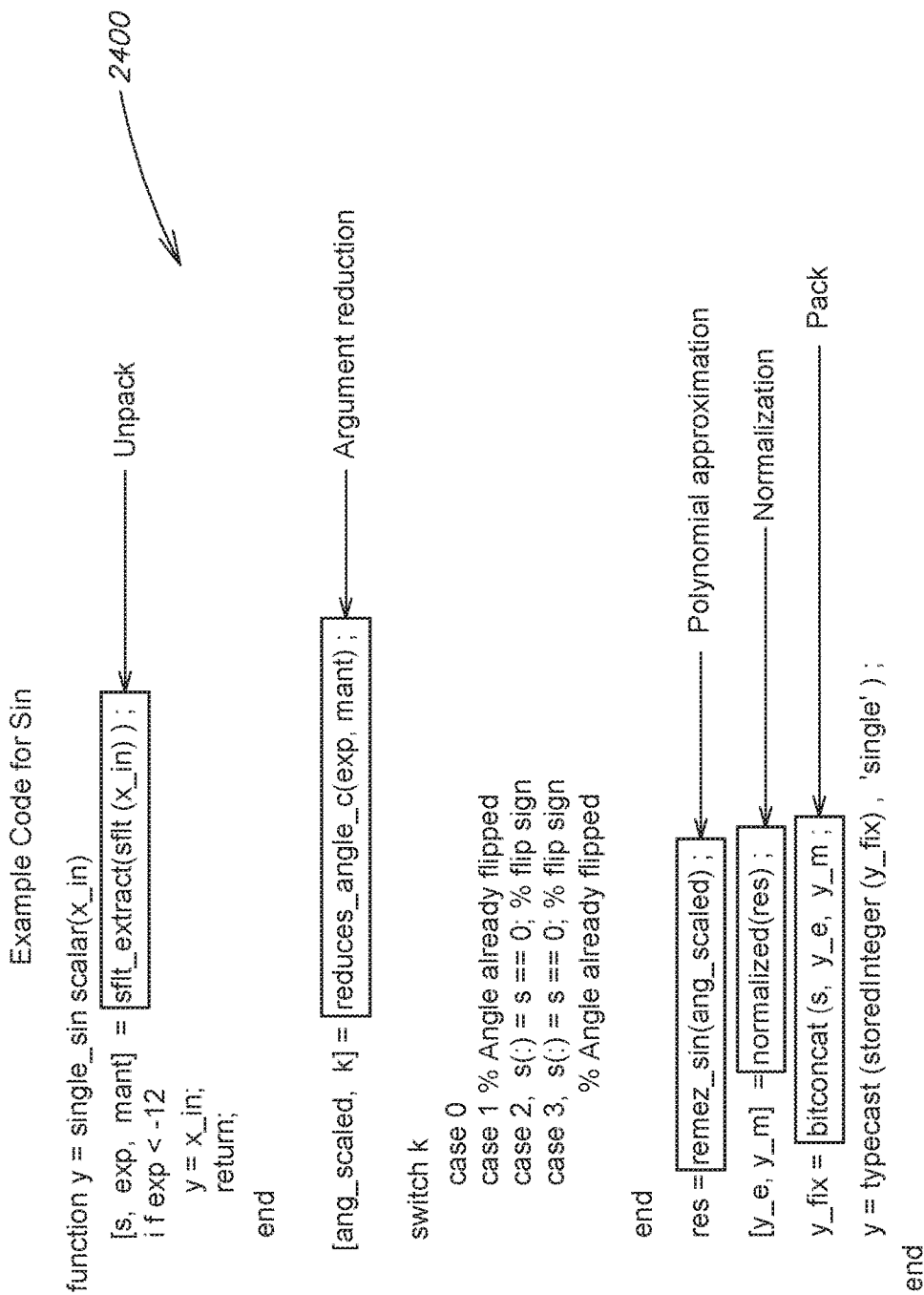
FIG. 24 is example code in accordance with an embodiment.

FIG. 24 is example code 2400 for Sin. The code 2400 includes a function 'sflt_extract( ) that unpacks the input, x_in, to produce separate sign (s), exponent (exp), and mantissa (mant) values. The code 2400 includes a function 'reduce_angle_c( ) that performs argument reduction on the exp and mant values. The code 2400 further includes a polynomial approximation function 'remez_sin' for computing the result (res). The code 2400 then normalizes res. The output of the normalization is packed using a function called 'bitconcat'.

FIG. 25 is example code 2500 for Product. The code 2500 unpacks a first input, nfp_in1, of the product operation, into sign (AS), exponent (AE), and mantissa (AM), and a second input, nfp_in2, into sign (BS), exponent (BE), and mantissa (BM). The code 2500 also packs the result of the product operation.

Figure 26:
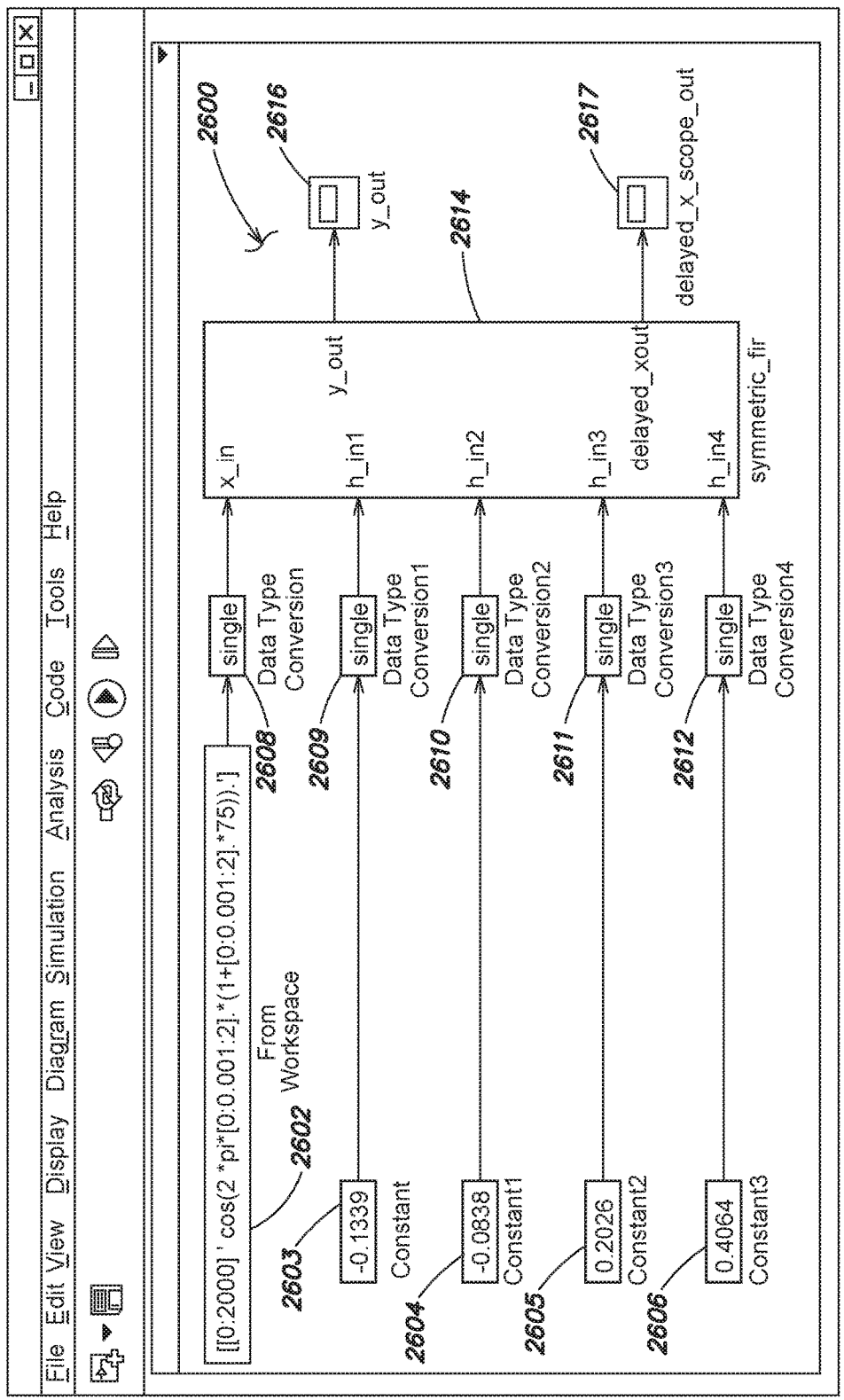
FIG. 26 is a schematic illustration of an example executable graphical model in accordance with an embodiment.

FIG. 26 is an illustration of an example graphical model 2600 in accordance with an embodiment. The model 2600 includes a From Workspace block 2602 and four Constant blocks 2603-2606. The model 2600 further includes five data type conversion blocks 2608-2612, a subsystem 2614 labeled 'symmetric_fir', and two scope blocks 2616 and 2617. The subsystem 2614 receives five input values from the five source blocks 2602-2606, and produces two outputs that are received by the two scope blocks 2616 and 2617.

Figure 27:
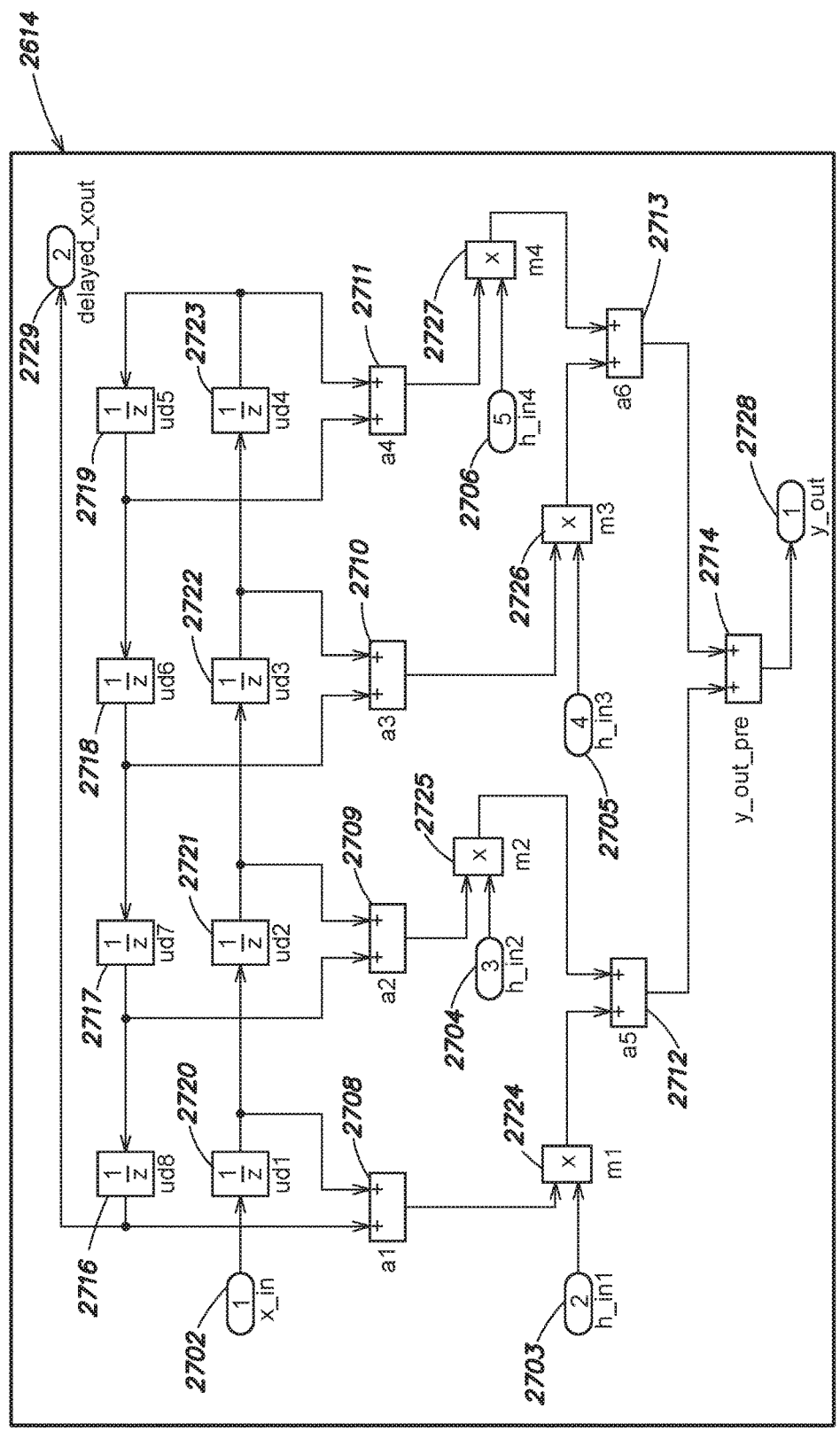
FIG. 27 is a schematic illustration of an example subsystem of the executable graphical model of FIG. 26.

FIG. 27 is a schematic illustration of the subsystem 2614 of the graphical model 2600 that has been opened to illustrate the interconnected blocks that form the subsystem 2614. The subsystem 2614 includes five inport blocks 2702-2706, seven add blocks 2708-2714, eight unit delay blocks 2716-2723, and four multiply blocks 2724-2727, and two outport blocks 2728 and 2729. The subsystem 2614 operates on inputs having a single precision data type, and generates outputs having a single precision data type. In addition, the add blocks 2708-2714 and the multiply blocks 2724-2727 operate on inputs having a single precision data type and produce outputs having a single precision data type.

In an embodiment, the single precision data types of the subsystem 2614 may be interpreted as a combination of for example integers representing sign (S), exponent (E), and mantissa (M). In addition, code may be generated for the subsystem 2614 and/or the model 2600.

Appendix A is example code, namely VHDL code, generated for the subsystem 2614. The generated code of Appendix A references code for an Add block and a Multiply block. Appendix B is example code, namely VHDL code, generated for an Add block of the subsystem 2614. Appendix C is example code, namely VHDL code, generated for a Multiply block of the subsystem 2614.

Figure 18:
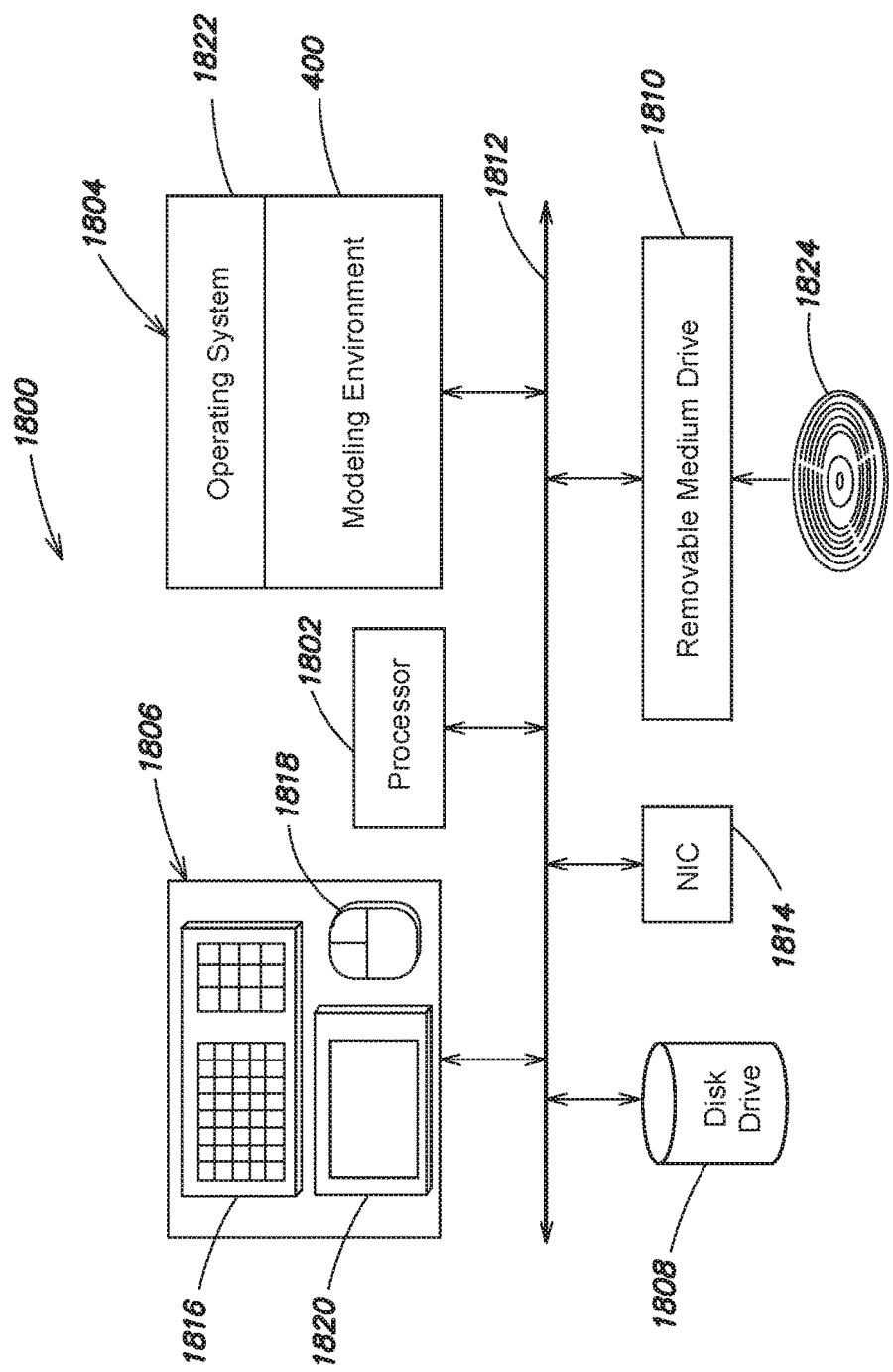
FIG. 18 is a schematic illustration of an example data processing system in accordance with an embodiment.

FIG. 18 is a schematic illustration of a computer or data processing system 1800 for implementing an embodiment of the invention. The computer system 1800 may include one or more processing elements, such as a processor 1802, a main memory 1804, user input/output (I/O) 1806, a persistent data storage unit, such as a disk drive 1808, and a removable medium drive 1810 that are interconnected by a system bus 1812. The computer system 1800 may also include a communication unit, such as a network interface card (NIC) 1814. The user I/O 1806 may include a keyboard 1816, a pointing device, such as a mouse 1818, and a display 1820. Other user I/O 1806 components include voice or speech command systems, touchpads and touchscreens, printers, projectors, etc. Exemplary processors include single or multi-core Central Processing Units (CPUs), Graphics Processing Units (GPUs), Field Programmable Gate Arrays (FPGAs), Application Specific Integrated Circuits (ASICs), microprocessors, microcontrollers, etc.

The main memory 1804, which may be a Random Access Memory (RAM), may store a plurality of program libraries or modules, such as an operating system 1822, and one or more application programs that interface to the operating system 1822, such as the modeling environment 1800.

The removable medium drive 1810 may accept and read a computer readable medium 1826, such as a CD, DVD, floppy disk, solid state drive, tape, flash memory or other non-transitory medium. The removable medium drive 1810 may also write to the computer readable medium 1824.

Suitable computer systems include personal computers (PCs), workstations, servers, laptops, tablets, palm computers, smart phones, electronic readers, and other portable computing devices, etc. Nonetheless, those skilled in the art will understand that the computer system 1800 of FIG. 18 is intended for illustrative purposes only, and that the present invention may be used with other computer, data processing, or computational systems or devices. The present invention may also be used in a computer network, e.g., client-server, architecture, or a public and/or private cloud computing arrangement. For example, the modeling environment 1800 may be hosted on one or more cloud servers or devices, and accessed by remote clients through a web portal or an application hosting system, such as the Remote Desktop Connection tool from Microsoft Corp.

Suitable operating systems 1822 include the Windows series of operating systems from Microsoft Corp. of Redmond, Wash., the Android and Chrome OS operating systems from Google Inc. of Mountain View, Calif., the Linux operating system, the MAC OS® series of operating systems from Apple Inc. of Cupertino, Calif., and the UNIX® series of operating systems, among others. The operating system 1822 may provide services or functions for applications or modules, such as allocating memory, organizing data objects or files according to a file system, prioritizing requests, managing I/O, etc. The operating system 1822 may run on a virtual machine, which may be provided by the data processing system 1800.

As indicated above, a user, such as an engineer, scientist, programmer, developer, etc., may utilize one or more input devices, such as the keyboard 1816, the mouse 1818, and the display 1820 to operate the modeling environment 1800, and construct and revise one or more models. As discussed, the models may be computational and may have executable semantics. In particular, the models may be simulated or run. In particular, the models may provide one or more of time-based, event-based, state-based, message-based, frequency-based, control-flow based, and dataflow-based execution semantics. The execution of a model may simulate operation of the system that is being designed or evaluated. The term graphical model is intended to include graphical program.

Exemplary modeling environments include the MATLAB® algorithm development environment and the Simulink® model-based design environment from The MathWorks, Inc., as well as the Simscape™ physical modeling system and the Stateflow® state chart tool also from The MathWorks, Inc., the MapleSim physical modeling and simulation tool from Waterloo Maple Inc. of Waterloo, Ontario, Canada, the LabVIEW virtual instrument programming system and the NI MatrixX model-based design product both from National Instruments Corp. of Austin, Tex., the Visual Engineering Environment (VEE) product from Agilent Technologies, Inc. of Santa Clara, Calif., the System Studio model-based signal processing algorithm design and analysis tool and the SPW signal processing algorithm tool from Synopsys, Inc. of Mountain View, Calif., a Unified Modeling Language (UML) system, a Systems Modeling Language (SysML) system, the System Generator system from Xilinx, Inc. of San Jose, Calif., and the Rational Rhapsody Design Manager software from IBM Corp. of Somers, N.Y. Models created in the high-level modeling environment may contain less implementation detail, and thus operate at a higher level than certain programming languages, such as the C, C++, C#, and SystemC programming languages.

Those skilled in the art will understand that the MATLAB® algorithm development environment is a math-oriented, textual programming environment for digital signal processing (DSP) design, among other uses. The Simulink® model-based design environment is a modeling tool for modeling and simulating dynamic and other systems, among other uses. The MATLAB® and Simulink® environments provide a number of high-level features that facilitate algorithm development and exploration, and support model-based design. Exemplary high-level features include dynamic typing, array-based operations, data type inferencing, sample time inferencing, and execution order inferencing, among others.

In some embodiments, a lower level programming language relative to the high-level modeling environment 400, such as the C, C++, C#, and SystemC programming languages, among others, may be used to create one or more models.

Models constructed within the modeling environment 400 may include textual models, graphical models, such as block diagrams, state-based models, and combinations thereof. A given model may simulate, e.g., approximate the operation of, a system.

Exemplary code generators include, but are not limited to, the Simulink Coder, the Embedded Coder, and the Simulink HDL Coder products from The MathWorks, Inc. of Natick, Mass., and the TargetLink product from dSpace GmbH of Paderborn Germany.

Figure 19:
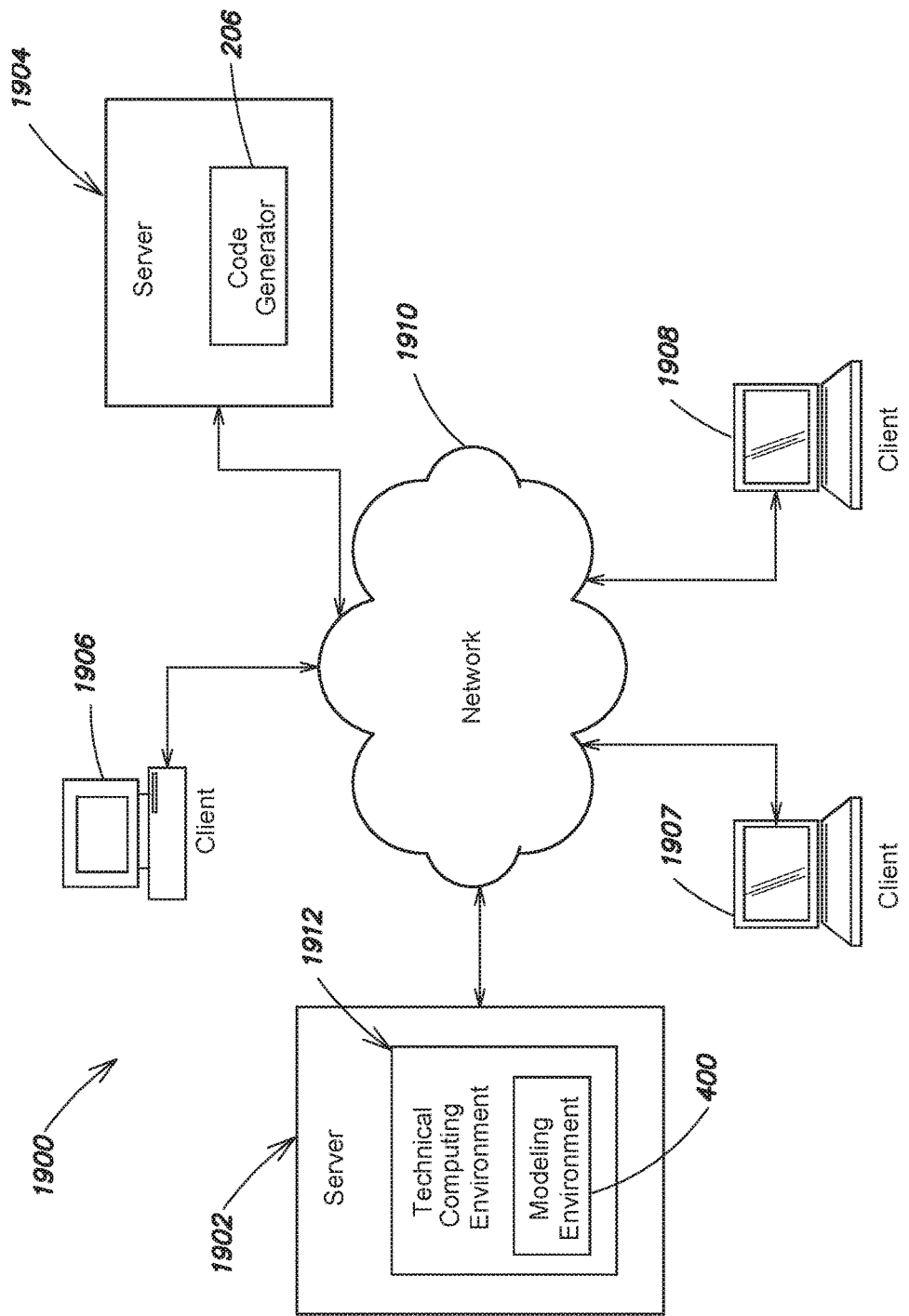
FIG. 19 is a schematic illustration of an example distributed computing environment in accordance with an embodiment.

FIG. 19 is a schematic diagram of a distributed computing environment 1900 in which systems and/or methods described herein may be implemented. The environment 1900 may include client and server devices, such as two servers 1902 and 1904, and three clients 1906-1308, interconnected by one or more networks, such as network 1910. The servers 1902 and 1904 may include applications or processes accessible by the clients 1906-1308. For example, the server 1902 may include a technical computing environment (TCE) 1912, which may include or have access to a modeling environment, such as the modeling environment 1800. The server 1904 may include a code generator, such as the code generator 1806. The devices of the environment 1900 may interconnect via wired connections, wireless connections, or a combination of wired and wireless connections.

The servers 1902 and 1904 may include one or more devices capable of receiving, generating, storing, processing, executing, and/or providing information. For example, the servers 1902 and 1904 may include a computing device, such as a server, a desktop computer, a laptop computer, a tablet computer, a handheld computer, or a similar device. In some implementations, the servers 1902 and 1904 may host the TCE 1912, the modeling environment 1800, and/or the code generator 1806.

The clients 1906-1308 may be capable of receiving, generating, storing, processing, executing, and/or providing information. Information may include any type of machine-readable information having substantially any format that may be adapted for use, e.g., in one or more networks and/or with one or more devices. The information may include digital information and/or analog information. The information may further be packetized and/or non-packetized. In an embodiment, the clients 1906-1308 may download data and/or code from the servers 1902 and 1904 via the network 1910. In some implementations, the clients 1906-1308 may be desktop computers, workstations, laptop computers, tablet computers, handheld computers, mobile phones (e.g., smart phones, radiotelephones, etc.), electronic readers, or similar devices. In some implementations, the clients 1906-1308 may receive information from and/or transmit information to the servers 1902 and 1904.

The network 1910 may include one or more wired and/or wireless networks. For example, the network 1910 may include a cellular network, a public land mobile network ("PLMN"), a local area network ("LAN"), a wide area network ("WAN"), a metropolitan area network ("MAN"), a telephone network (e.g., the Public Switched Telephone Network ("PSTN")), an ad hoc network, an intranet, the Internet, a fiber optic-based network, and/or a combination of these or other types of networks. Information may be exchanged between network devices using any network protocol, such as, but not limited to, the Internet Protocol (IP), Asynchronous Transfer Mode (ATM), Synchronous Optical Network (SONET), the User Datagram Protocol (UDP), Institute of Electrical and Electronics Engineers (IEEE) 802.11, etc.

The number of devices and/or networks shown in FIG. 19 is provided as an example. In practice, there may be additional devices and/or networks, fewer devices and/or networks, different devices and/or networks, or differently arranged devices and/or networks than those shown in FIG. 19. Furthermore, two or more devices shown in FIG. 19 may be implemented within a single device, or a single device shown in FIG. 19 may be implemented as multiple, distributed devices. Additionally, one or more of the devices of the distributed computing environment 1900 may perform one or more functions described as being performed by another one or more devices of the environment 1900.

The foregoing description of embodiments is intended to provide illustration and description, but is not intended to be exhaustive or to limit the disclosure to the precise form disclosed. Modifications and variations are possible in light of the above teachings or may be acquired from a practice of the disclosure. For example, while a series of acts has been described above with respect to the flow diagrams, the order of the acts may be modified in other implementations. In addition, the acts, operations, and steps may be performed by additional or other modules or entities, which may be combined or separated to form other modules or entities. Further, non-dependent acts may be performed in parallel. Also, the term "user", as used herein, is intended to be broadly interpreted to include, for example, a computer or data processing system or a human user of a computer or data processing system, unless otherwise stated.

Further, certain embodiments of the disclosure may be implemented as logic that performs one or more functions. This logic may be hardware-based, software-based, or a combination of hardware-based and software-based. Some or all of the logic may be stored in one or more tangible non-transitory computer-readable storage media and may include computer-executable instructions that may be executed by a computer or data processing system, such as system 1800. The computer-executable instructions may include instructions that implement one or more embodiments of the disclosure. The tangible non-transitory computer-readable storage media may be volatile or non-volatile and may include, for example, flash memories, dynamic memories, removable disks, and non-removable disks.

No element, act, or instruction used herein should be construed as critical or essential to the disclosure unless explicitly described as such. Also, as used herein, the article "a" is intended to include one or more items. Where only one item is intended, the term "one" or similar language is used. Further, the phrase "based on" is intended to mean "based, at least in part, on" unless explicitly stated otherwise.

The foregoing description has been directed to specific embodiments of the present disclosure. It will be apparent, however, that other variations and modifications may be made to the described embodiments, with the attainment of some or all of their advantages. For example, generated code may be utilized advantageously with other embedded hardware, such as embedded hardware that includes floating point cores. Therefore, it is the object of the appended claims to cover all such variations and modifications as come within the true spirit and scope of the disclosure.

EXAMPLES

The following examples implement one or more aspects of methods and/or systems of the present disclosure. These examples are non-limiting examples. Features of different examples may be combined in other implementations. Features of each example may be modified or removed in other implementations.

Aspect 1. A method for generating code for a model, the model comprising at least one substructure, wherein the at least one substructure comprises an operator to operate on one or more inputs, at least one of the one more inputs having a floating point data type, the method comprising:
  Receiving at least one design objective, the at least one design objective imposing constraints on code generated from the model;
  Determining that code generated for the at least one substructure violates the at least one design objective;
  Interpreting and decomposing at least one of the one or more first inputs as a sign, a mantissa, and an exponent, and
  Generating code for the model, the generated code comprising:
    instructions for the one of the one or more inputs, wherein the instructions comprise variables representing the sign, the mantissa, and/or the exponent; and
    instructions for a function that performs functionalities on the variables when the instructions are executed, the function having equivalent behavior as the operator operating on the one or more inputs.

Aspect 2. The method according to any of the previous aspects, wherein the at least one design objective comprises hardware performance constraints, including:
  Timing, in particular a clock speed;
  Area, in particular a maximum number of logic element;
  Identity of a particular type of programmable logic device to which generated code is deployed; and/or
  Power consumption.

Aspect 3. The method according to any of the previous aspects, wherein the method further comprises:
  Detecting overflow and/or underflow conditions that occur in floating point calculations within the model during the execution of the generated code, wherein the detecting is based on the sign, the mantissa and the exponent.

Aspect 4. The method according to any of the previous aspects, wherein the generated code comprises C code, C++ code, HDL code, VHDL code Verilog, System Verilog, PLC code, assembly code or executable binary code.

Aspect 5. The method according to any of the previous aspects, wherein the operator is a multiplication of at least two inputs, wherein the instructions for the function comprise instructions for:
- an XOR operation applied to the variables representing the signs of the at least two inputs;
- an ADD operation applied to the variables representing the exponents of the at least two inputs; and
- a MULTIPLY operation applied to the variables representing the mantissa of the at least two inputs.

Aspect 6. A computer-readable medium storing instructions that when executed by at least one processor cause the at least one processor to implement a method according to any of the previous aspects.

What is claimed is:

1. A method for replacing floating point calculations with integer calculations in at least one of programmable hardware, embedded hardware, or a data processing device, the method comprising:
   accessing, from a memory, a model comprising model elements, where
     a first model element comprises a first operator to operate on one or more first inputs,
     a second model element comprises a second operator to operate on one or more second inputs,
     one of the one or more first inputs has a first data type,
     one of the one or more second inputs has a second data type,
     the second data type is the same as, or is different from, the first data type,
     the first and second data types comprise single, double, half precision, or integer,
     the first operator including a floating point operation, and
     values of the one or more first inputs are in a form comprising floating point, integer, or fixed point,
   analyzing the first operator and the one or more first inputs, the analyzing comprising analyzing the first data type,
   determining whether the one or more first inputs are to be interpreted based on the analyzing the first operator and the one or more first inputs,
   interpreting the one of the one or more first inputs as a first integer, a second integer, and a third integer, and
   generating code for the model, the generating code comprising generating first code for the one or more first inputs and the first operator, wherein the first code comprises variables representing the first integer, the second integer, or the third integer and a function in place of the first operator that includes the floating point operation, where the function performs integer functionalities on the variables representing the first operator operating on the one of the one or more first inputs.

2. The method of claim 1, wherein the first integer, the second integer, and the third integer represent a sign, an exponent, and a mantissa that correspond to the one of the one or more first inputs interpreted based on Institute of Electrical and Electronics Engineers (IEEE) standard 754.

3. The method of claim 1, wherein the code comprises C code, C++ code, HDL (hardware description language) code, VHDL (VHSIC Hardware Description Language), Verilog, SystemVerilog, PLC (programmable logic controller) code that complies with International Electrotechnical Commission (IEC) 61131-3 standard, assembly code, or executable binary code.

4. The method of claim 1, wherein the model and the code are in a same programming language, the model comprises a floating point algorithm, and the code is free of any floating point numeric or expressions.

5. The method of claim 1, wherein the first code comprises instructions for synthesizing the programmable hardware or the embedded hardware that does not have the capability in handling floating point values.

6. The method of claim 5, wherein the programmable hardware or the embedded hardware comprises integer-only micro controllers, FPGA (field-programmable gate array) units without floating point cores, or PLC units without floating point support.

7. The method of claim 1, wherein the one or more first inputs have different data types and the determining comprises determining that fewer than all of the one or more first inputs are to be interpreted.

8. The method of claim 7, wherein the first code comprises other variables representing those of the one or more first inputs that are not interpreted.

9. The method of claim 1, wherein the model comprises a textual model, a graphical model, or a model that includes a graphical component and a textual component, and the model comprises floating point numbers or expressions.

10. The method of claim 1, wherein the model comprises a Simulink model, a MATLAB model, a Simscape model, a Stateflow model, a Modelica model, a UML (unified modeling language) model, or a Systems Modeling Language (SysML) model.

11. The method of claim 1, wherein the first code comprises constant data representing the first integer, the second integer, or the third integer, wherein the constant data is generated based on the one or more inputs and an analysis of the model.

12. The method of claim 1, comprising analyzing the second operator and the one or more second inputs, the analyzing the second operator and the one or more second inputs comprising analyzing the second data type, and determining whether the one or more second inputs are to be interpreted, independently of determining whether the one or more first inputs are to be interpreted.

13. The method of claim 1, wherein the model comprises a group of model elements comprising a group of operators, one or more inputs to the group of model elements have fixed point values, one or more outputs from the group of model elements have floating point values, and inputs and outputs inside the group have floating point values, the method further comprising:
   analyzing the model to identify the group of model elements,
   converting the one or more inputs to the group of model elements to one or more converted inputs that have floating point values and the one or more outputs from the group of model elements into one or more converted outputs that have fixed point values, and
   interpreting each of the one or more converted inputs and the inputs and outputs inside the group to three integers.

14. The method of claim 1, wherein the model elements comprise multiple operators comprising the first and the second operators, each of the multiple operators operating on one or more respective inputs, and a first set of the multiple operators having floating point values for the one or more respective inputs, a second set of the multiple operators having fixed point values for the one or more respective inputs, and a third set of the multiple operators having floating point values and fixed point values for the one or more respective inputs, and the method further comprising:
forming, based on functionalities of the multiple operators and data types of the respective inputs, at least two groups of operators, wherein a first one of the at least two groups comprises operators operating on respective inputs having floating point values and a second one of the at least two groups comprises operators operating on respective inputs having fixed point values, and
interpreting each of the respective inputs of each operator in the first one of the at least two groups as a respective first integer, a respective second integer, and a respective third integer.

15. The method of claim 14, comprising interpreting the respective one or more inputs of selected ones of the multiple operators to reach a consistent interpretation for all inputs of the multiple operators in the model.

16. The method of claim 14, wherein the code generated for the model comprises variables representing the respective first integer, the respective second integer, and the respective third integer, and variables representing the respective one or more inputs of the operators in the second one of the at least two groups.

17. The method of claim 1, comprising analyzing the model to determine absence of one or more numerical conditions that are part of an Institute of Electrical and Electronics Engineers (IEEE) standard, and wherein the generating code for the model comprises generating code that complies with the IEEE standard without accounting for the one or more numerical conditions that have been determined to be absent from the model.

18. The method of claim 17, wherein the one or more numerical conditions comprise occurrence of values including denormals or subnormals, negative or positive infinities, negative or positive zeros, or NaNs (not a number) that comprises quiet NaNs or signaling NaNs.

19. The method of claim 17, wherein the analyzing the model comprises analyzing the first, second, and third integers.

20. The method of claim 17, wherein the analyzing the model comprises analyzing the model using static methods.

21. The method of claim 1, comprising detecting overflow or underflow conditions that occur in floating point calculations within the model and that are not in compliance with Institute of Electrical and Electronics Engineers (IEEE) 754 standard, and wherein the overflow or underflow conditions comprise negative or positive overflows or underflows, or zero, and wherein the detecting is based on the first, second, and third integers.

22. A method for use with at least one of programmable hardware, embedded hardware, or a data processing device, the method comprising:
accessing, from a memory, an executable model, the executable model including a portion specifying floating point operations that operate on values with a floating point data type, the floating point data type including a sign element, an exponent element, and a mantissa element;
interpreting, by a processor coupled to the memory, the sign element, the exponent element, and the mantissa element of the values as one or more of an integer data type, a fixed point data type, or a Boolean data type;
replacing, by the processor, the floating point operations with operations that
are equivalent to the floating point operations and operate on the sign element, the exponent element, and the mantissa element of the values interpreted as the one or more of the integer data type, the fixed point data type, or the Boolean data type; and at least one of
generating code, by the processor, for at least the portion of the executable model, where the generated code includes generated code segments that correspond to the operations that are equivalent to the floating point operations and that operate on the sign element, the exponent element, and the mantissa element of the values interpreted as the one or more of the integer data type, the fixed point data type, or the Boolean data type, or
generating execution instructions, by the processor, for at least the portion of the executable model, where the execution instructions implement the operations that are equivalent to the floating point operations and that operate on the sign element, the exponent element, and the mantissa element of the values interpreted as the one or more of the integer data type, the fixed point data type, or the Boolean data type.

23. The method of claim 22, wherein the execution instructions are implemented as an in-memory representation.

24. One or more non-transitory computer-readable media, having stored thereon instructions that when executed by a computing device, cause the computing device to perform operations for replacing floating point calculations with integer calculations in at least one of programmable hardware, embedded hardware, or the computing device comprising:
accessing, from a memory, a model comprising model elements, where
a first model element comprises a first operator to operate on one or more first inputs,
a second model element comprises a second operator to operate on one or more second inputs,
one of the one or more first inputs has a first data type,
one of the one or more second inputs has a second data type,
the second data type is the same as, or is different from, the first data type,
the first and second data types comprise single, double, half precision, or integer,
the first operator including a floating point operation, and
values of the one or more first inputs are in a form comprising floating point, integer, or fixed point,
analyzing the first operator and the one or more first inputs, the analyzing comprising analyzing the first data type,
determining whether the one or more first inputs are to be interpreted based on the analyzing the first operator and the one or more first inputs,
interpreting the one of the one or more first inputs as a first integer, a second integer, and a third integer, and
generating code for the model, the generating code comprising generating first code for the one or more first inputs and the first operator, wherein the first code comprises variables representing the first integer, the second integer, or the third integer and a function in place of the first operator that includes the floating point operation, where the function performs integer functionalities on the variables representing the first operator operating on the one of the one or more first inputs.

25. The one or more non-transitory computer-readable media of claim 24, wherein the first integer, the second integer, and the third integer represent a sign, an exponent, and a mantissa that correspond to the one of the one or more first inputs interpreted based on Institute of Electrical and Electronics Engineers (IEEE) standard 754.

26. The one or more non-transitory computer-readable media of claim 24, wherein the code comprises C code, C++ code, HDL (hardware description language) code, VHDL (VHSIC Hardware Description Language), Verilog, SystemVerilog, PLC (programmable logic controller) code that complies with International Electrotechnical Commission (IEC) 61131-3 standard, assembly code, or executable binary code.

27. The one or more non-transitory computer-readable media of claim 24, wherein the model and the code are in a same programming language, the model comprises a floating point algorithm, and the code is free of any floating point numeric or expressions.

28. The one or more non-transitory computer-readable media of claim 24, wherein the first code comprises instructions for synthesizing the programmable hardware or the embedded hardware that does not have the capability in handling floating point values.

29. The one or more non-transitory computer-readable media of claim 28, wherein the programmable hardware or the embedded hardware comprises integer-only micro controllers, FPGA (field-programmable gate array) units without floating point cores, or PLC units without floating point support.

30. The one or more non-transitory computer-readable media of claim 24, wherein the one or more first inputs have different data types and the determining comprises determining that fewer than all of the one or more first inputs are to be interpreted.

31. The method of claim 23 further comprising:
generating an executable verification or validation model; and
comparing the code generated for at least the portion of the executable model to the executable model or to the verification or validation model.

32. The method of claim 31 wherein the executable verification or validation model is generated from the in-memory representation.

33. The method of claim 22 wherein the floating point data type is double, single, or half.

34. An apparatus for replacing floating point calculations with integer calculations in at least one of programmable hardware, embedded hardware, or a data processing device, the apparatus comprising:
a memory storing a model comprising model elements, where
a first model element comprises a first operator to operate on one or more first inputs,
a second model element comprises a second operator to operate on one or more second inputs,
one of the one or more first inputs has a first data type,
one of the one or more second inputs has a second data type,
the second data type is the same as, or is different from, the first data type,
the first and second data types comprise single, double, half precision, or integer,
the first operator including a floating point operation, and
values of the one or more first inputs are in a form comprising floating point, integer, or fixed point; and
one or more processors coupled to the memory, the one or more processors configured to:
analyze the first operator and the one or more first inputs, the analyze comprising analyzing the first data type,
determine whether the one or more first inputs are to be interpreted based on the analyze the first operator and the one or more first inputs,
interpret the one of the one or more first inputs as a first integer, a second integer, and a third integer, and
generate code for the model, the generate code comprising generating first code for the one or more first inputs and the first operator, wherein the first code comprises variables representing the first integer, the second integer, or the third integer and a function in place of the first operator that includes the floating point operation, where the function performs integer functionalities on the variables representing the first operator operating on the one of the one or more first inputs.

35. The apparatus of claim 34, wherein the first integer, the second integer, and the third integer represent a sign, an exponent, and a mantissa that correspond to the one of the one or more first inputs interpreted based on Institute of Electrical and Electronics Engineers (IEEE) standard 754.

36. The apparatus of claim 34, wherein the code comprises C code, C++ code, HDL (hardware description language) code, VHDL (VHSIC Hardware Description Language), Verilog, SystemVerilog, PLC (programmable logic controller) code that complies with International Electrotechnical Commission (IEC) 61131-3 standard, assembly code, or executable binary code.

37. The apparatus of claim 34, wherein the model and the code are in a same programming language, the model comprises a floating point algorithm, and the code is free of any floating point numeric or expressions.

38. The apparatus of claim 34, wherein the first code comprises instructions for synthesizing the programmable hardware or the embedded hardware that does not have the capability in handling floating point values.

39. The apparatus of claim 38, wherein the programmable hardware or the embedded hardware comprises integer-only micro controllers, FPGA (field-programmable gate array) units without floating point cores, or PLC units without floating point support.

40. The apparatus of claim 34, wherein the one or more first inputs have different data types and the determining comprises determining that fewer than all of the one or more first inputs are to be interpreted.

41. One or more non-transitory computer-readable media, having stored thereon instructions that when executed by a computing device, cause the computing device to perform operations for replacing floating point calculations with integer calculations in at least one of programmable hardware, embedded hardware, or the computing device comprising:
accessing, from a memory, an executable model, the executable model including a portion specifying floating point operations that operate on values with a floating point data type, the floating point data type including a sign element, an exponent element, and a mantissa element;

interpreting, by a processor coupled to the memory, the sign element, the exponent element, and the mantissa element of the values as one or more of an integer data type, a fixed point data type, or a Boolean data type;

replacing, by the processor, the floating point operations with operations that
are equivalent to the floating point operations and
operate on the sign element, the exponent element, and the
mantissa element of the values interpreted as the one or more of the integer data type, the fixed point data type, or the Boolean data type; and at least one of
generating code, by the processor, for at least the portion of the executable model, where the generated code includes generated code segments that correspond to the operations that are equivalent to the floating point operations and that operate on the sign element, the exponent element, and the mantissa element of the values interpreted as the one or more of the integer data type, the fixed point data type, or the Boolean data type, or
generating execution instructions, by the processor, for at least the portion of the executable model, where the execution instructions implement the operations that are equivalent to the floating point operations and that operate on the sign element, the exponent element, and the mantissa element of the values interpreted as the one or more of the integer data type, the fixed point data type, or the Boolean data type.

42. The one or more non-transitory computer-readable media of claim 41, wherein the execution instructions are implemented as an in-memory representation.

43. The one or more non-transitory computer-readable media of claim 42 further comprising:
generating an executable verification or validation model; and
comparing the code generated for at least the portion of the executable model to the executable model or to the verification or validation model.

44. The one or more non-transitory computer-readable media of claim 43 wherein the executable verification or validation model is generated from the in-memory representation.

45. The one or more non-transitory computer-readable media of claim 41 wherein the floating point data type is double, single, or half.

* * * * *

UNITED STATES PATENT AND TRADEMARK OFFICE
CERTIFICATE OF CORRECTION

PATENT NO. : 10,140,099 B2  
APPLICATION NO. : 15/398176  
DATED : November 27, 2018  
INVENTOR(S) : Kiran K. Kintali et al.

Page 1 of 2

It is certified that error appears in the above-identified patent and that said Letters Patent is hereby corrected as shown below:

In the Specification

Column 7, Line 57 reads:  
"E = 11 - 127 = 138 (base 10) = 10001010 (base 2)."  
Should read:  
--E = 11 + 127 = 138 (base 10) = 10001010 (base 2).--

Column 18, Line 58 reads:  
"Sin, Cos, and A tan (arc tangent) operations, respectively, an"  
Should read:  
--Sin, Cos, and Atan (arc tangent) operations, respectively, an--

Column 20, Line 53 reads:  
"computational elements, such as Sin, Cos A tan, Add,"  
Should read:  
--computational elements, such as Sin, Cos Atan, Add,--

Column 20, Line 55 reads:  
"Sort, A tan 2, and Square Root, may be constructed and"  
Should read:  
--Sort, Atan2, and Square Root, may be constructed and--

Column 21, Line 67 reads:  
"or are difficult to create, such as a tan 2 operators."  
Should read:  
--or are difficult to create, such as atan2 operators.--

Column 22, Line 8 reads:  
"use withprogrammable logic devices or microcontrollers"

Signed and Sealed this  
Ninth Day of March, 2021

Drew Hirshfeld  
*Performing the Functions and Duties of the*  
*Under Secretary of Commerce for Intellectual Property and*  
*Director of the United States Patent and Trademark Office*

Should read:
--use with programmable logic devices or microcontrollers--

Column 23, Line 28 reads:
"method (HOTBM) and low-area but high latency Homer"
Should read:
--method (HOTBM) and low-area but high latency Horner--

Column 28, Line 4 reads:
"formula (cos + j sin) in accordance with an embodiment. For"
Should read:
--formula (cos + jsin) in accordance with an embodiment. For--